(12) United States Patent
Na et al.

(10) Patent No.: US 12,501,545 B2
(45) Date of Patent: Dec. 16, 2025

(54) CIRCUIT BOARD

(71) Applicant: LG INNOTEK CO., LTD., Seoul (KR)

(72) Inventors: Se Woong Na, Seoul (KR); Jung Eun Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 322 days.

(21) Appl. No.: 17/920,495

(22) PCT Filed: Apr. 23, 2021

(86) PCT No.: PCT/KR2021/005180
§ 371 (c)(1),
(2) Date: Oct. 21, 2022

(87) PCT Pub. No.: WO2021/215879
PCT Pub. Date: Oct. 28, 2021

(65) Prior Publication Data
US 2023/0171886 A1 Jun. 1, 2023

(30) Foreign Application Priority Data

Apr. 23, 2020 (KR) .................. 10-2020-0049578

(51) Int. Cl.
*H05K 1/02* (2006.01)
*A61K 48/00* (2006.01)
(Continued)

(52) U.S. Cl.
CPC .......... *C12N 15/86* (2013.01); *A61K 48/005* (2013.01); *A61K 48/0058* (2013.01);
(Continued)

(58) Field of Classification Search
CPC .......... C12N 15/86; C12N 2750/14133; C12N 2750/14143; C12N 2830/008;
(Continued)

(56) References Cited

U.S. PATENT DOCUMENTS 6,124,553 A * 9/2000 Narizuka .......... H01L 23/49838
257/E23.07
8,158,888 B2 * 4/2012 Shen ................... H01L 23/3128
174/255

(Continued)

FOREIGN PATENT DOCUMENTS

CN        107969077      4/2018
JP        05-327163      12/1993
(Continued)

OTHER PUBLICATIONS

International Search Report dated Aug. 13, 2021 issued in Application No. PCT/KR2021/005180.
(Continued)

*Primary Examiner* — Ishwarbhai B Patel
(74) *Attorney, Agent, or Firm* — KED & ASSOCIATES, LLP

(57) ABSTRACT

A printed circuit board according to an embodiment comprises: an insulating layer; a circuit pattern disposed on the upper surface of the insulating layer; a support layer which is disposed on the upper surface of the insulating layer to expose the upper surface of the circuit pattern and is in contact with the sides of the circuit pattern; and a protective layer disposed on the upper surfaces of the support layer and the circuit pattern, wherein the upper region of the insulating layer comprises a first region and a second region, and the protective layer comprises an open region exposing the upper surfaces of the support layer and the circuit pattern that are disposed in the first region, and the support layer comprises a first upper surface positioned at the highest level among the upper surfaces of the support layer and a second upper surface positioned at the lowest level among the upper surfaces of the support layer, the second upper surface being lower than the first upper surface, and the protective layer comprises a first portion which contacts the upper surface of (Continued)

the circuit pattern of the first region and a second portion which contacts the upper surface of the support layer of the first region, and the second portion of the protective layer contacts the second upper surface of the support layer and includes a first lower surface which is lower than the upper surface of the circuit pattern.

20 Claims, 15 Drawing Sheets

(51) Int. Cl.
*C12N 15/86* (2006.01)
*H05K 1/03* (2006.01)
*H05K 1/11* (2006.01)

(52) U.S. Cl.
CPC ....... *A61K 48/0066* (2013.01); *H05K 1/0296* (2013.01); *H05K 1/03* (2013.01); *C12N 2750/14133* (2013.01); *C12N 2750/14143* (2013.01); *C12N 2830/008* (2013.01); *H05K 2201/2081* (2013.01)

(58) Field of Classification Search
CPC ........ C12N 2750/14145; A61K 48/005; A61K 48/0058; A61K 49/0066; H05K 1/0296; H05K 1/03; H05K 2201/2081; H05K 1/11; H05K 3/28; H05K 3/34; H05K 3/46; H05K 1/111; H05K 3/3452; H05K 3/4644; A61P 25/00
See application file for complete search history.

(56) References Cited

U.S. PATENT DOCUMENTS

| | | | | |
|---|---|---|---|---|
| 8,319,115 | B2* | 11/2012 | Ohsumi | ............ H01L 23/49811 |
| | | | | 174/262 |
| 9,029,708 | B2* | 5/2015 | Oosawa | ................. H05K 1/056 |
| | | | | 360/245.9 |
| 9,326,389 | B2 | 4/2016 | Yokoyama | |
| 2013/0126224 | A1* | 5/2013 | Kim | ..................... H05K 3/3452 |
| | | | | 174/262 |
| 2014/0196939 | A1* | 7/2014 | Nishida | .................... H05K 3/28 |
| | | | | 174/261 |
| 2014/0284081 | A1 | 9/2014 | Nishida et al. | |
| 2015/0216059 | A1 | 7/2015 | Hayashi et al. | |
| 2015/0334837 | A1* | 11/2015 | Nishida | ................. H01L 23/498 |
| | | | | 174/251 |
| 2015/0364539 | A1 | 12/2015 | Im et al. | |

FOREIGN PATENT DOCUMENTS

| | | |
|---|---|---|
| JP | 2003-017850 | 1/2003 |
| JP | 2007103648 | 4/2007 |
| KR | 10-2014-0069213 | 6/2014 |
| KR | 10-2015-0142936 | 12/2015 |
| KR | 10-2016-0013007 | 2/2016 |
| KR | 10-2016-0016688 | 2/2016 |
| KR | 10-1596173 | 2/2016 |
| KR | 10-2017-0122500 | 11/2017 |
| KR | 10-1878242 | 7/2018 |

OTHER PUBLICATIONS

Korean Office Action dated Jan. 6, 2025 issued in Application No. 10-2020-0049578.

* cited by examiner

[FIG. 1A]
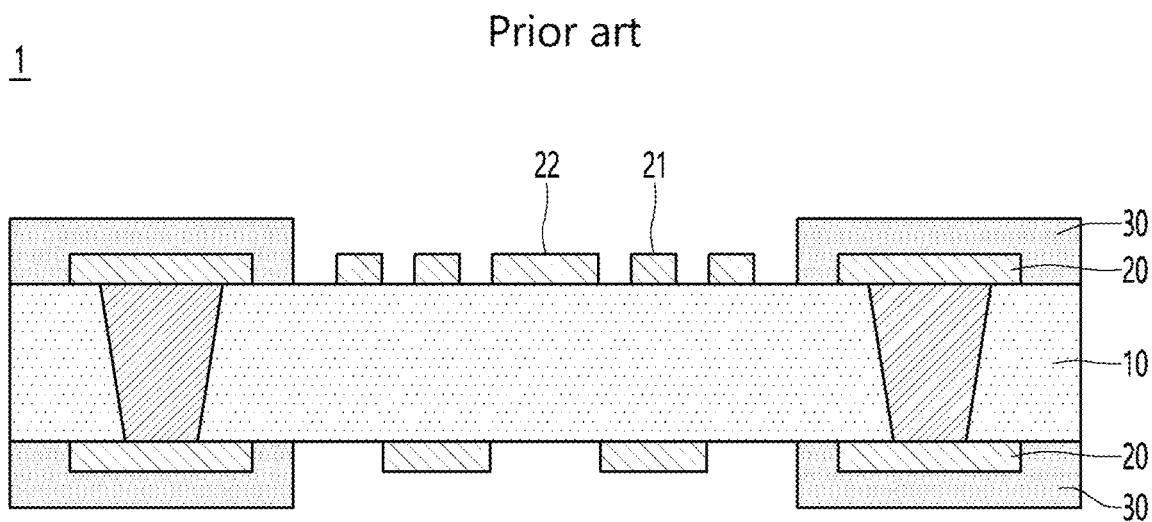
[FIG. 1B]
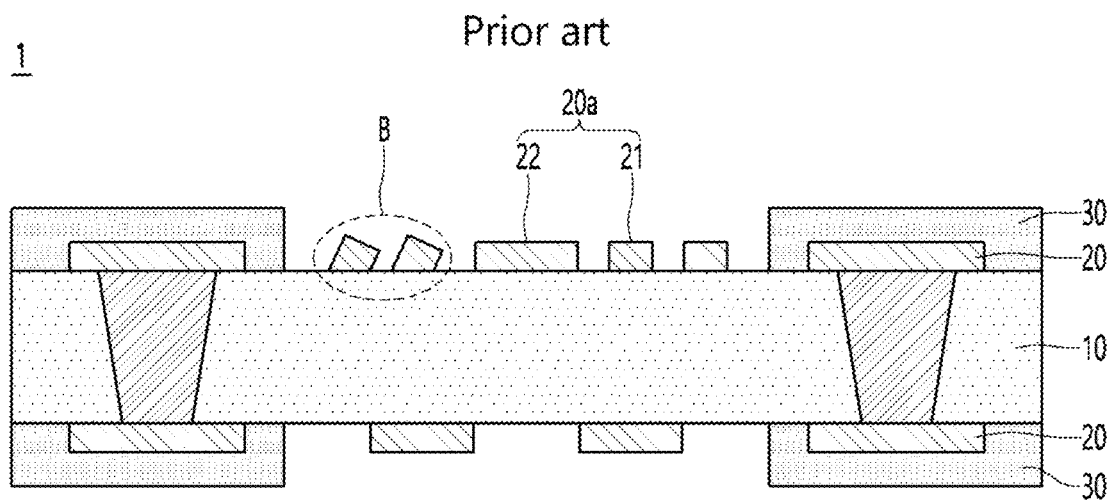

[FIG. 2]
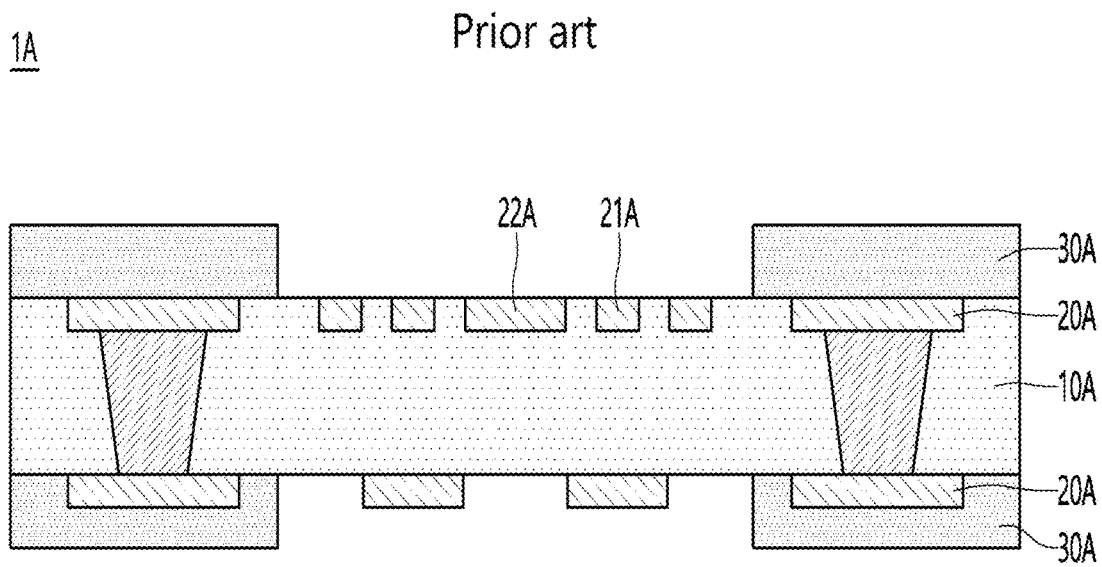
Prior art

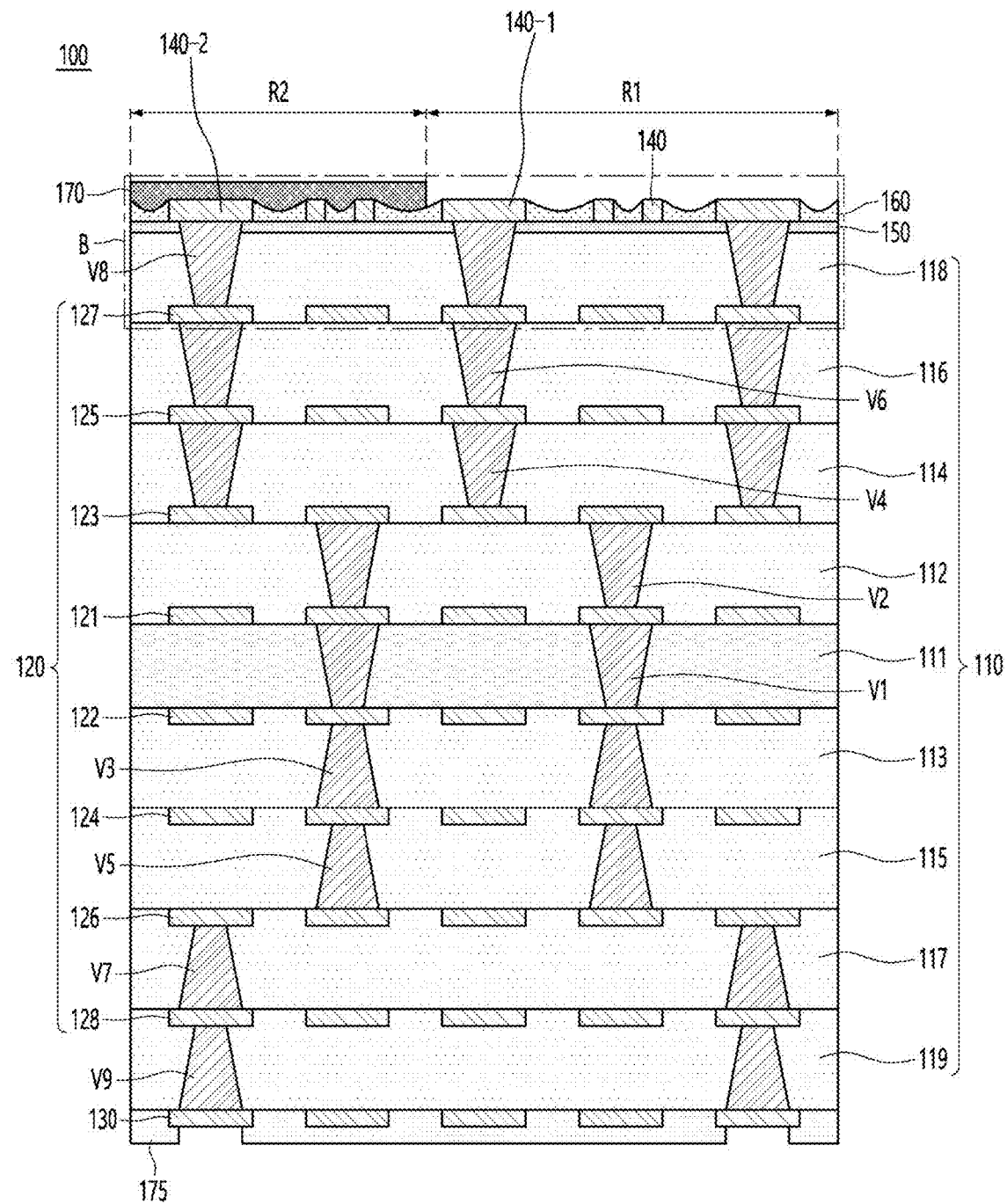
[FIG. 3]

[FIG. 4A]
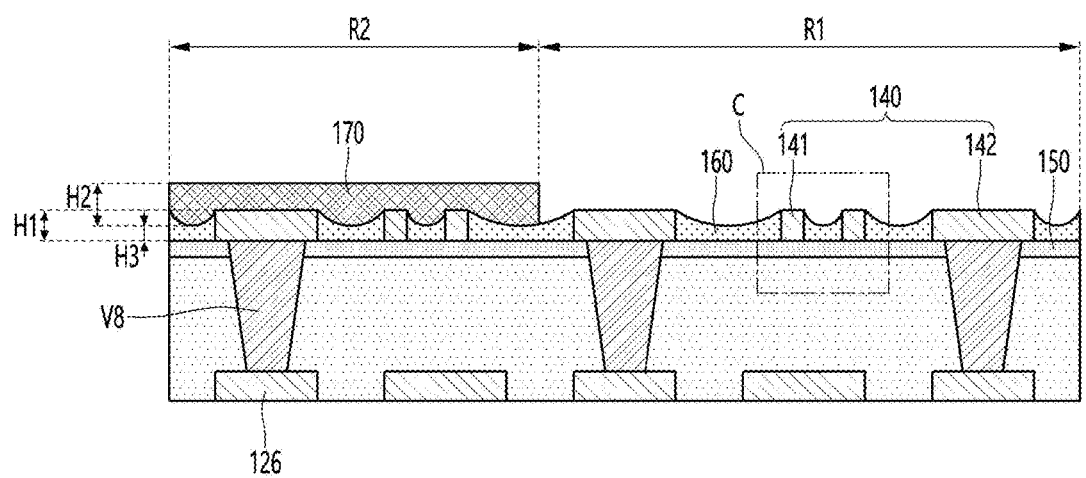
[FIG. 4B]
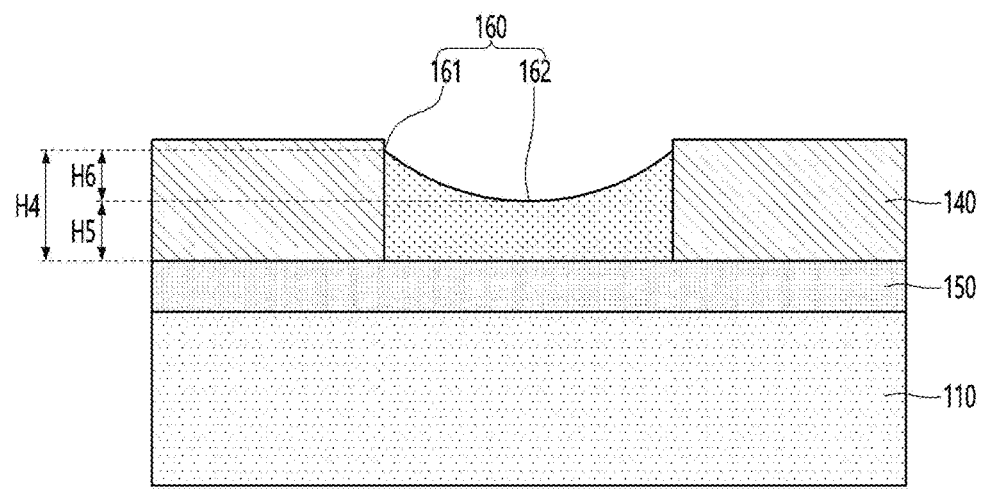

[FIG. 5]
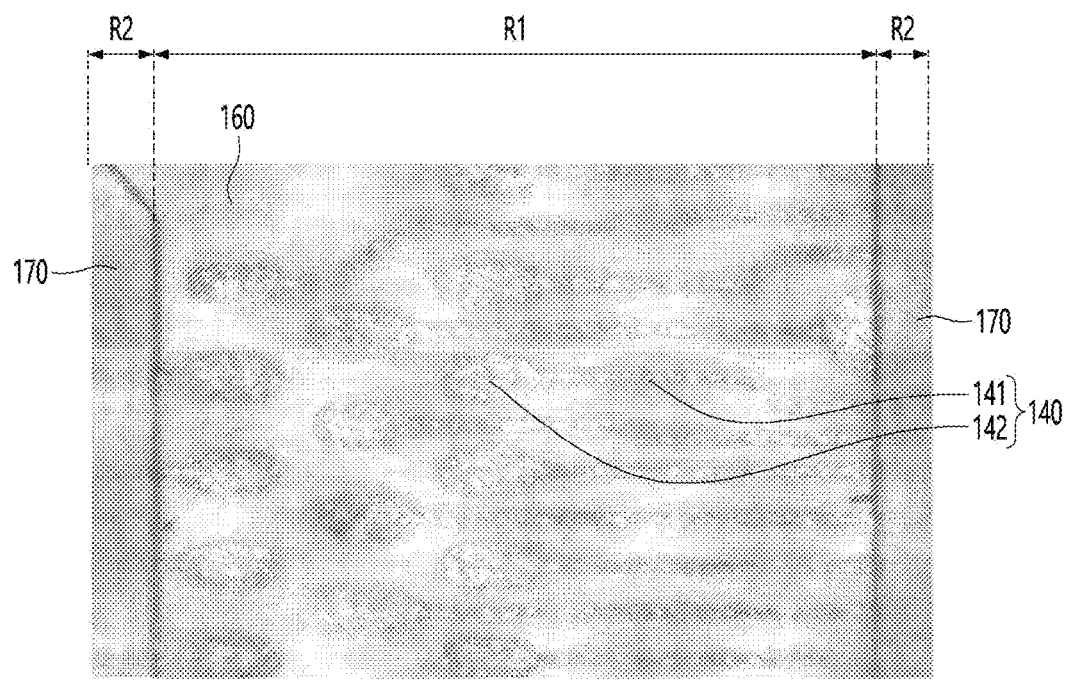

[FIG. 6]
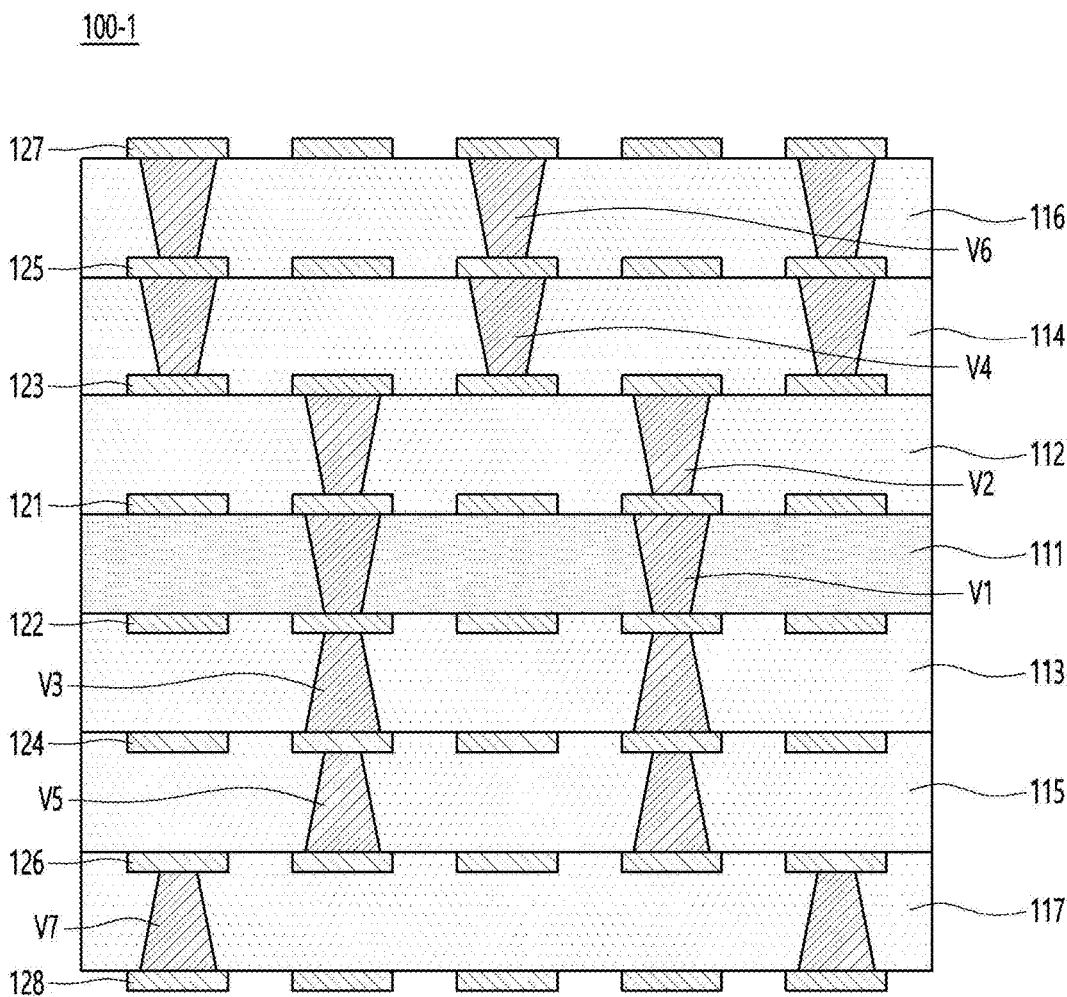

【FIG. 7】
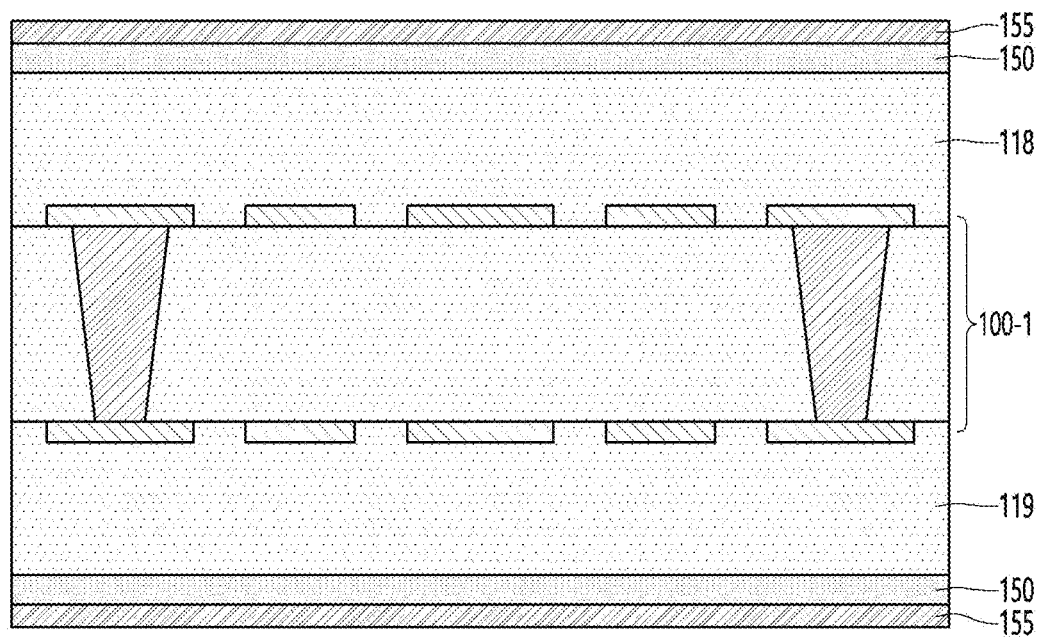
【FIG. 8】
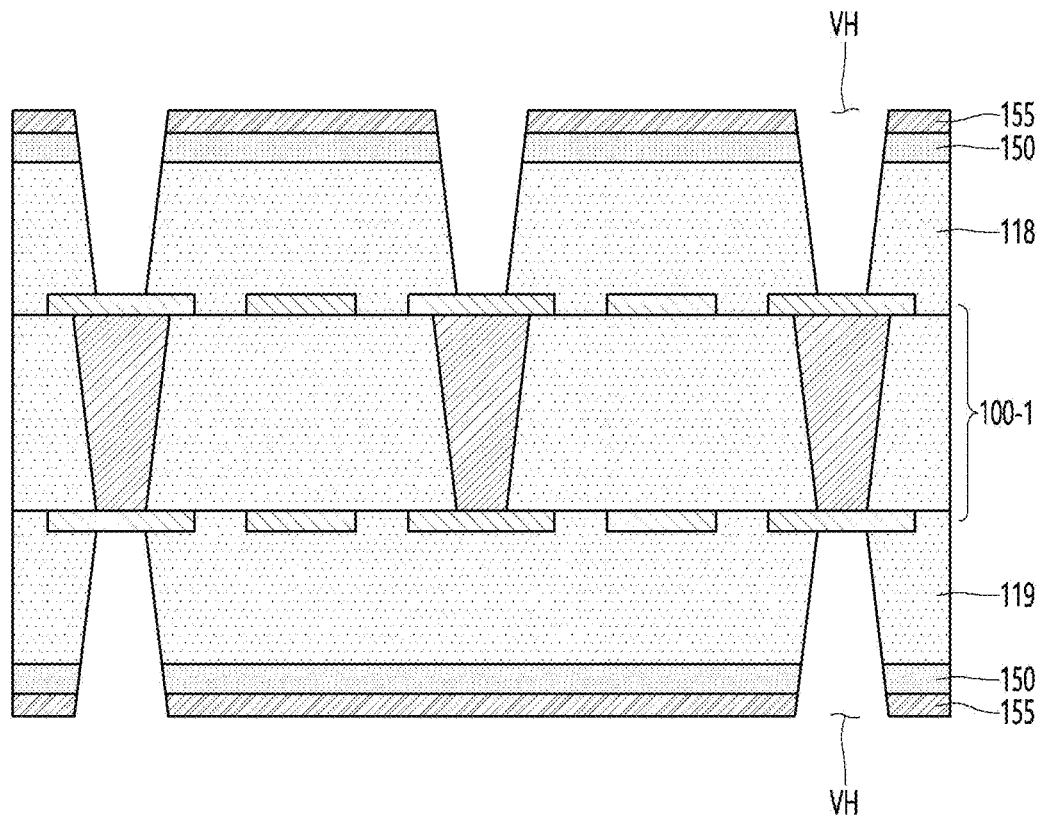

[FIG. 9]
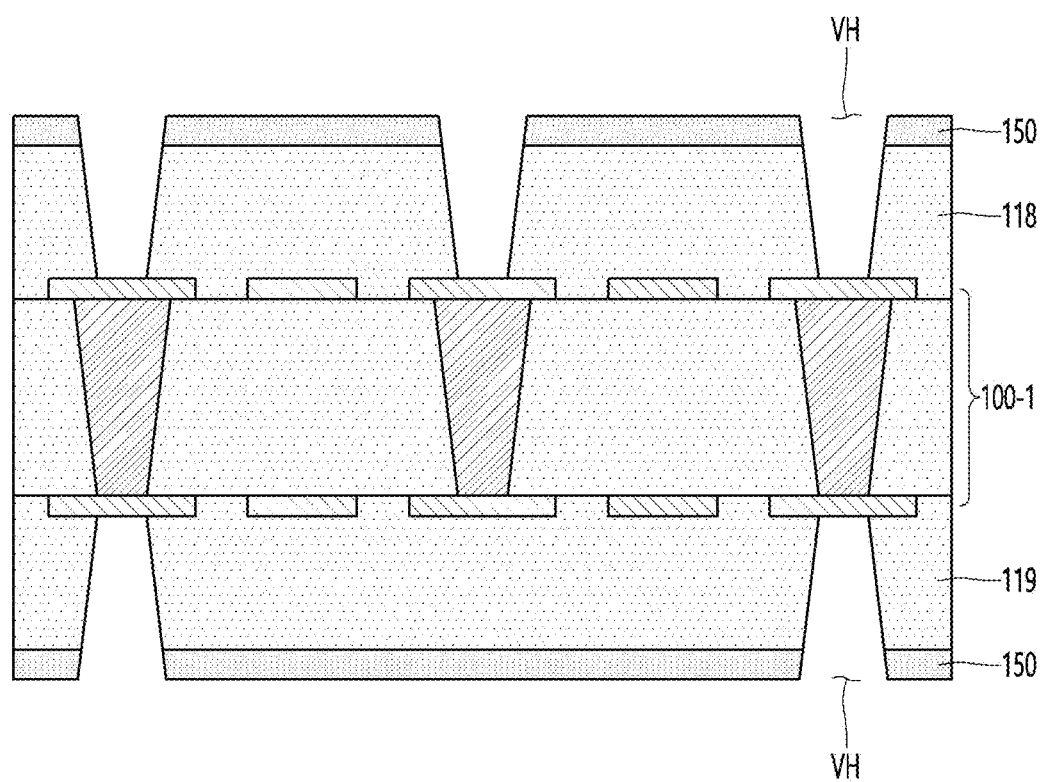

[FIG. 10]
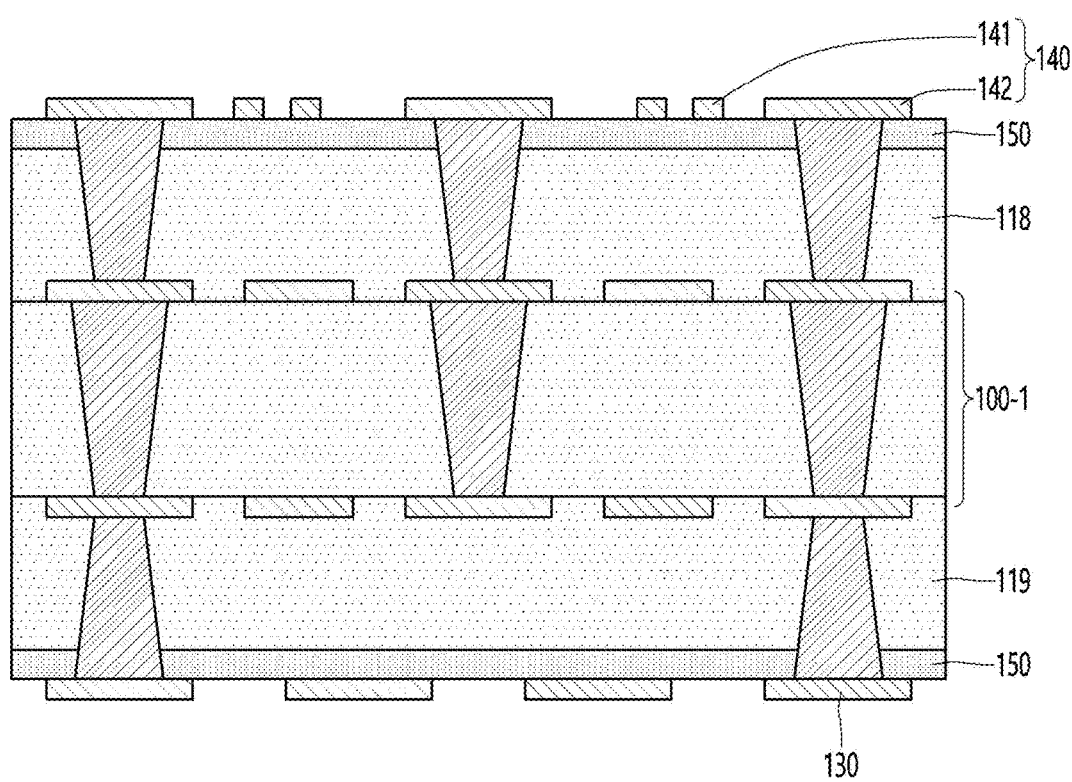

[FIG. 11]
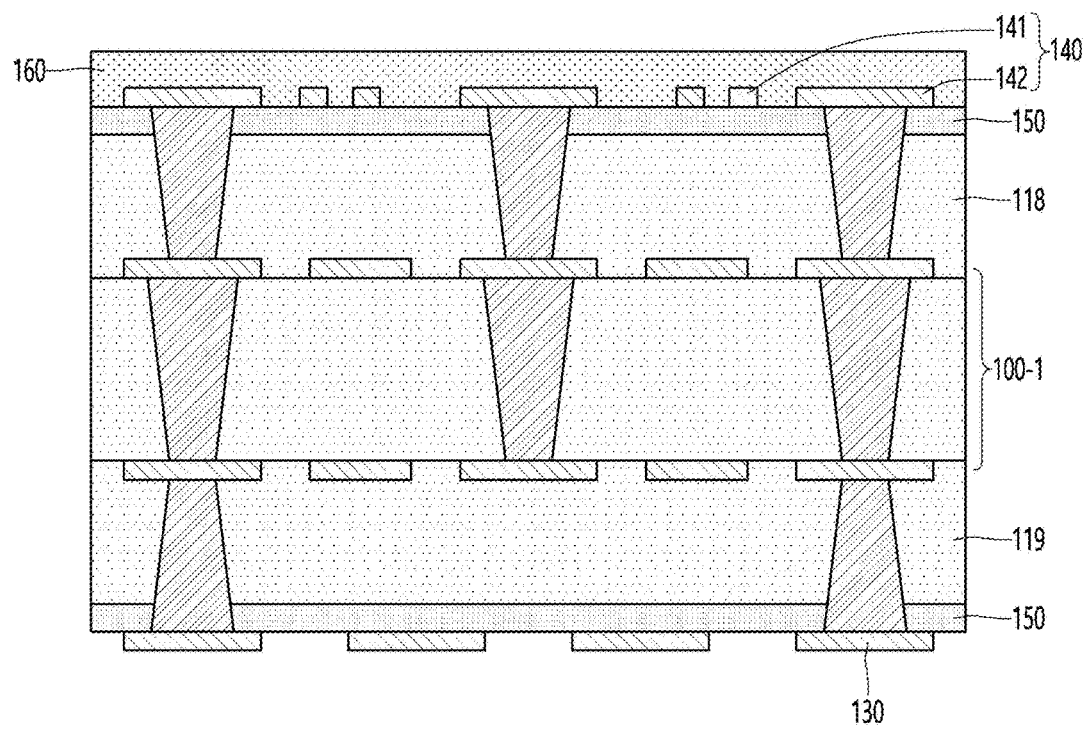

[FIG. 12]
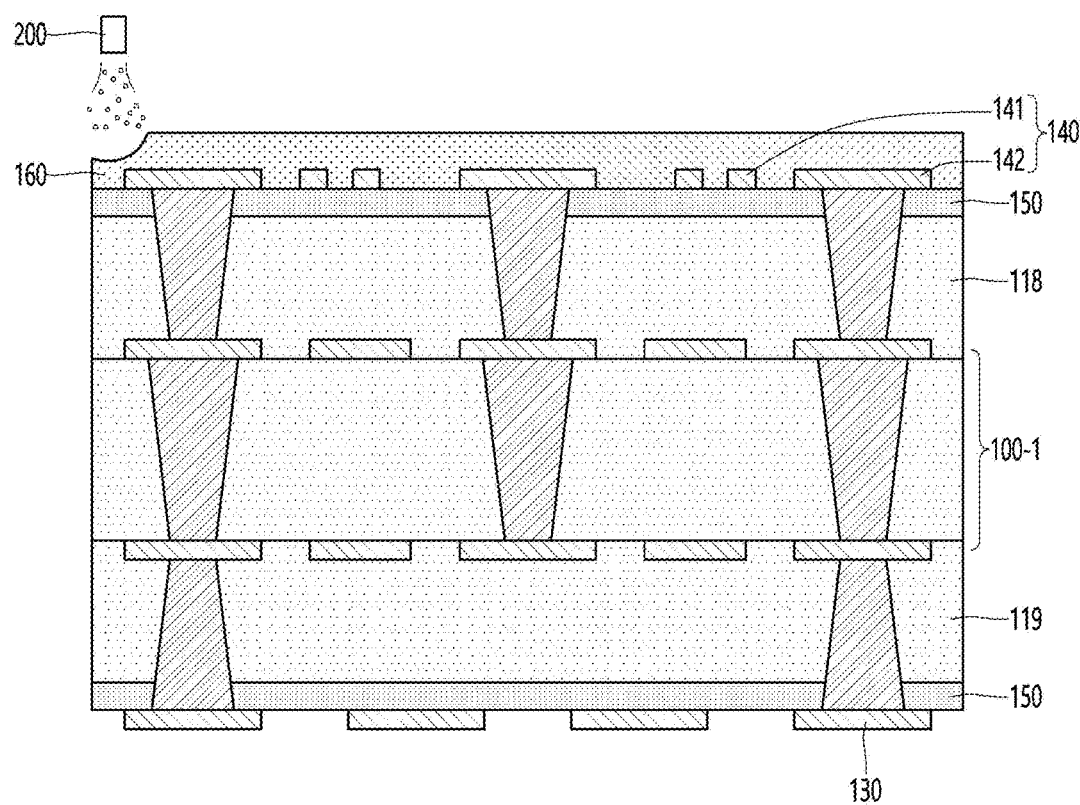

[FIG. 13]
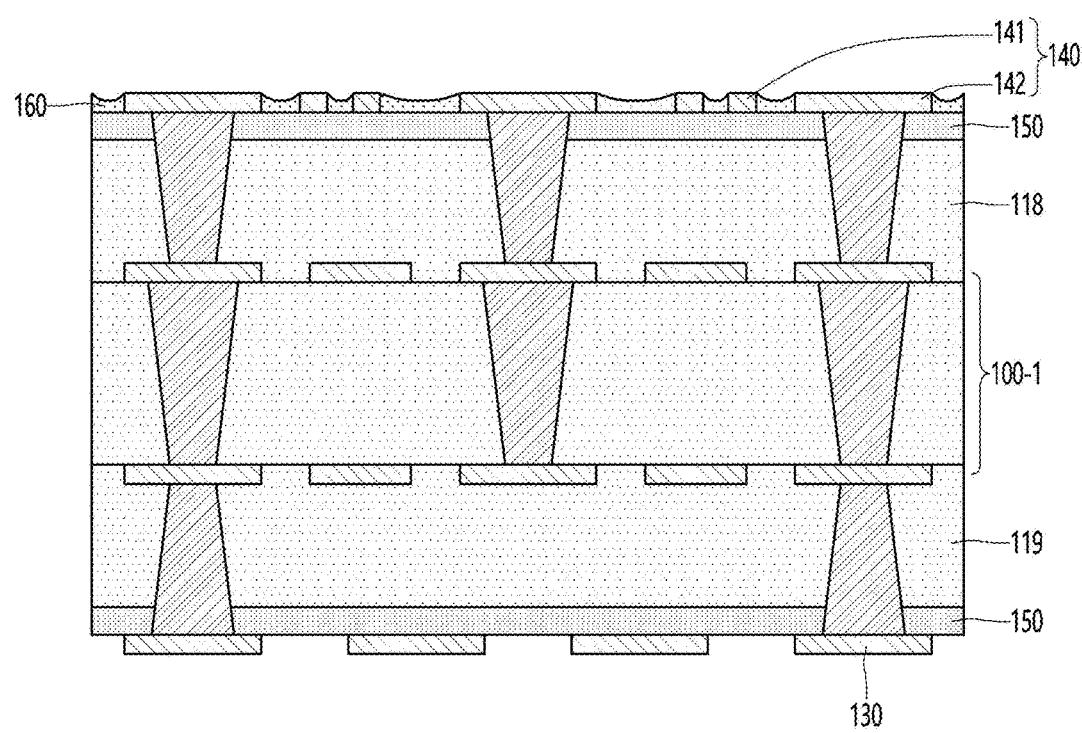

[FIG. 14A]
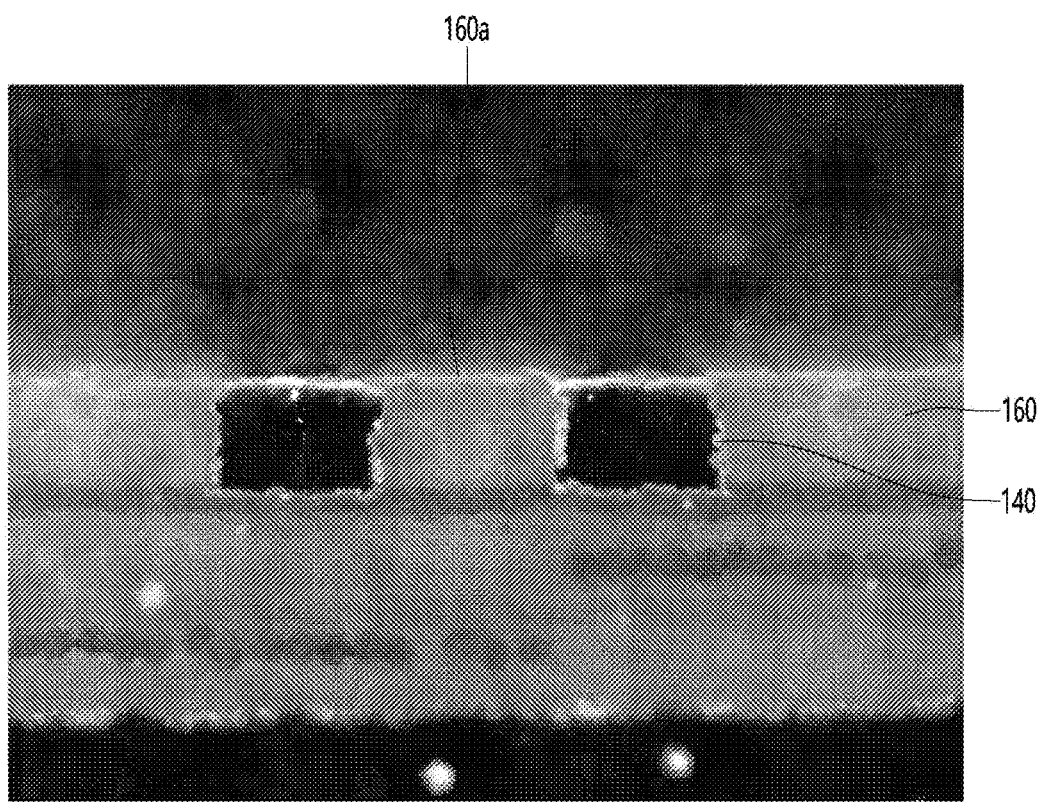

[FIG. 14B]
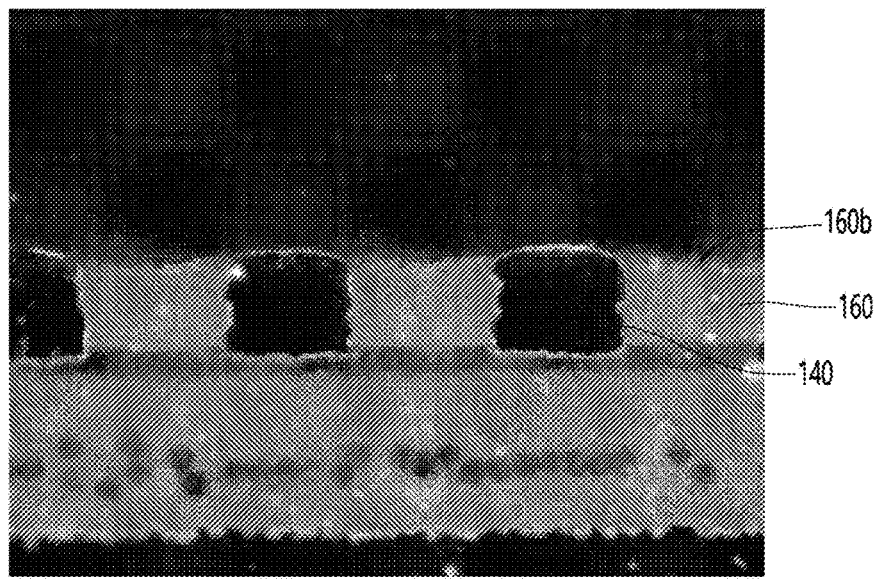
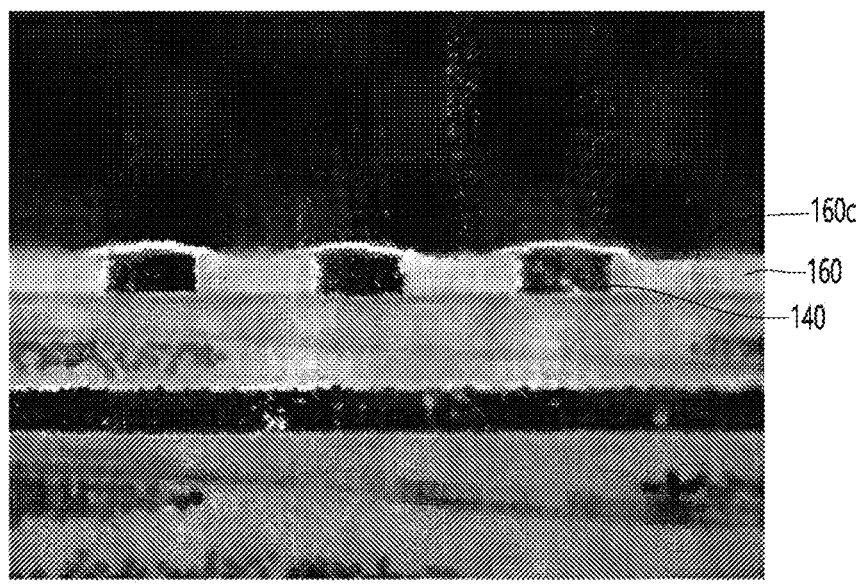

[FIG. 15]
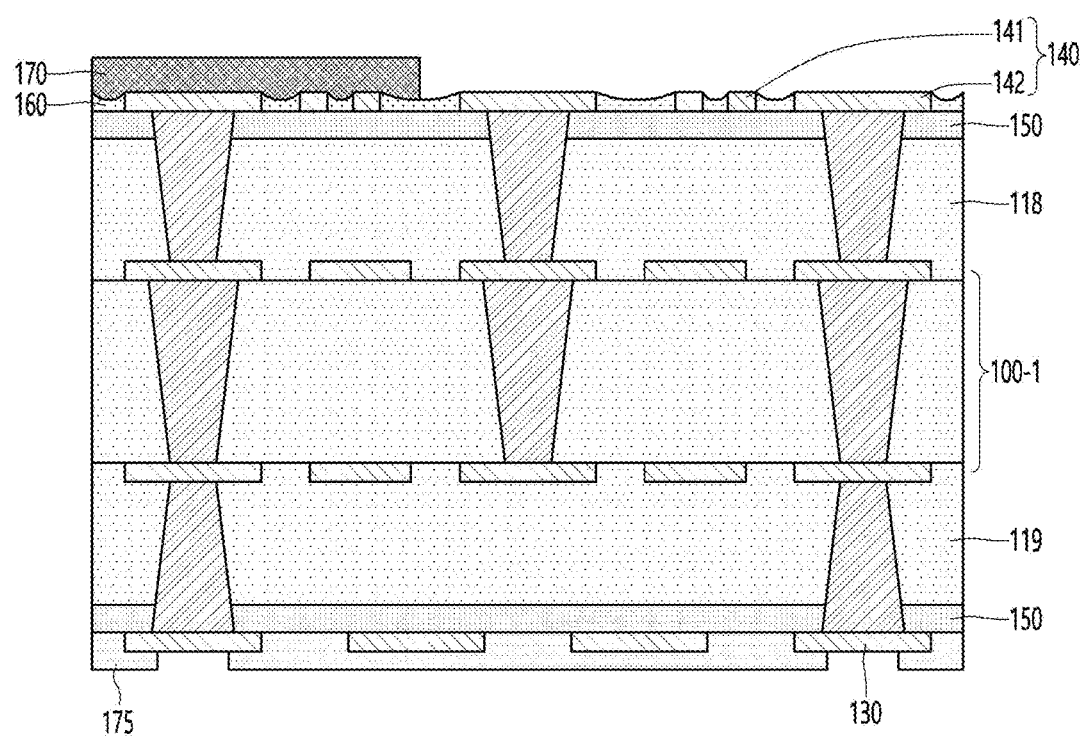

CIRCUIT BOARD

CROSS-REFERENCE TO RELATED PATENT APPLICATIONS

This application is a U.S. National Stage Application under 35 U.S.C. § 371 of PCT Application No. PCT/KR2021/005180, filed Apr. 23, 2021, which claims priority to Korean Patent Application No. 10-2020-0049578, filed Apr. 23, 2020, whose entire disclosures are hereby incorporated by reference.

TECHNICAL FIELD

The embodiment relates to a circuit board, and more particularly, to a circuit board including a support insulating layer for supporting a circuit pattern disposed on an outermost layer and a method of manufacturing the same.

BACKGROUND ART

As miniaturization, weight reduction, and integration of an electronic component are accelerated, a line width of a circuit has been made fine. In particular, as a design rule of a semiconductor chip is integrated on a nanometer scale, a circuit line width of a package substrate or a printed circuit board on which the semiconductor chip is mounted has been made fine to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for making the circuit pitch fine.

Meanwhile, recently, in order to meet a demand for wireless data traffic, efforts have been made to develop an improved 5G (5th generation) communication system or a pre-5G communication system. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

In addition, the circuit board applied to the 5G communication system as described above is manufactured in a trend of light, thin and compact, and accordingly, the circuit pattern is becoming gradually finer.

However, a circuit board including a conventional fine circuit pattern has a structure in which a circuit pattern disposed at an outermost portion protrudes above an insulating layer, and thus there is problem that the circuit pattern of the outermost portion easily collapses.

DISCLOSURE

Technical Problem

An embodiment provides a circuit board having a new structure and a method of manufacturing the same.

In addition, the embodiment provides a circuit board capable of improving reliability by providing a structure in which a support insulating layer capable of supporting a circuit pattern disposed at an outermost portion is disposed and a method of manufacturing the same.

In addition, the embodiment provides a circuit board capable of improving bonding force between the support insulating layer and a solder resist by making the upper surface of the support insulating layer have a curved surface instead of a flat surface, and a method for manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes: an insulating layer; a circuit pattern disposed on an upper surface of the insulating layer; a support layer disposed to expose an upper surface of the circuit pattern on an upper surface of the insulating layer and in contact with a side surface of the circuit pattern; and a protective layer disposed on the support layer and the upper surface of the circuit pattern, wherein an upper region of the insulating layer includes a first region and a second region, the protective layer includes an open region exposing the support layer and the upper surface of the circuit pattern disposed on the first region, the support layer includes a first upper surface positioned at a highest position in an upper surface of the support layer and a second upper surface positioned at a lowest position in the upper surface of the support layer, the protective layer includes a first portion in contact with an upper surface of the circuit pattern in the second region and a second portion in contact with an upper surface of the support layer in the second region, wherein the second portion of the protective layer includes a first lower surface in contact with the second upper surface of the support layer and positioned lower than the upper surface of the circuit pattern.

In addition, the first upper surface of the support layer is positioned closer to the circuit pattern than the second upper surface of the support layer.

In addition, the first upper surface of the support layer is positioned in an edge region of the upper surface of the support layer, the second upper surface of the support layer is positioned in a central region of the upper surface of the support layer, and a height of the upper surface of the support layer decreases from the edge region toward the central region.

In addition, the first lower surface of the protective layer is positioned lower than the upper surface of the circuit pattern by a first height, and the first height satisfies a range of 20% to 50% of a height of the circuit pattern.

In addition, a height of the second upper surface of the support layer satisfies a range of 50% to 90% of a height of the circuit pattern.

In addition, a height of the first upper surface of the support layer satisfies a range of 90% to 100% of the height of the circuit pattern.

In addition, a difference value between the height of the first upper surface and the height of the second upper surface satisfies a range of 10% to 20% of the height of the circuit pattern.

In addition, the upper surface of the support layer has a concave shape in which a height of an edge region is higher than that of a central region, and a lower surface of the second portion of the protective layer has a convex shape corresponding to the concave shape of the upper surface of the support layer.

In addition, the insulating layer is configured in plural, and the circuit pattern is disposed to protrude above a surface of the insulating layer disposed at the uppermost or lowest side among the plurality of insulating layers.

In addition, the circuit board includes a primer layer disposed between the upper surface of the insulating layer, a lower surface of the support layer, and a lower surface of the circuit pattern.

Meanwhile, a method of manufacturing a circuit board according to an embodiment includes manufacturing an inner layer substrate, forming an uppermost insulating layer in which a primer layer is disposed on an upper surface thereof on the inner layer substrate, forming a circuit pattern on the primer layer of the uppermost insulating layer, forming a support layer on the primer layer and the circuit pattern, removing an upper region of the support layer through a sand blasting process to expose an upper surface of the circuit pattern, and forming a protective layer on the support layer and the upper surface of the circuit pattern, wherein an upper region of the uppermost insulating layer includes a first region and a second region, the forming of the protective layer includes forming the protective layer on the support layer and the upper surface of the circuit pattern disposed in the second region while exposing the upper surface of the circuit pattern disposed in the first region, the exposing of the upper surface of the circuit pattern includes polishing the support layer so that a first upper surface adjacent to the circuit pattern among upper surfaces of the support layer has a height higher than a second upper surface by controlling a process condition of a sand blasting process, the forming of the protective layer includes forming a protective layer including a first portion in contact with the upper surface of the circuit pattern in the second region and a second portion in contact with the upper surface of the support layer in the second region, wherein the second portion of the protective layer includes a first lower surface in contact with the second upper surface of the support layer and positioned lower than the upper surface of the circuit pattern.

In addition, the controlling of the process condition includes adjusting at least one of a moving speed of the circuit board and an ejection pressure of an abrasive.

In addition, the first lower surface of the protective layer is positioned lower than the upper surface of the circuit pattern by a first height, and the first height satisfies a range of 20% to 50% of a height of the circuit pattern.

In addition, a height of the second upper surface of the support layer satisfies a range of 50% to 90% of the height of the circuit pattern.

In addition, a height of the first upper surface of the support layer satisfies a range of 90% to 100% of the height of the circuit pattern.

In addition, a difference value between the height of the first upper surface and the height of the second upper surface satisfies a range of 10% to 20% of the height of the circuit pattern.

Advantageous Effects

A circuit board in the embodiment is a circuit board having a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern positioned in a first region where a solder resist (SR) is not disposed among an upper region of the outer insulating layer and a second outer layer circuit pattern positioned in a second region where the solder resist is disposed. In this case, the second outer layer circuit pattern may be supported by the solder resist, but the first outer layer circuit pattern does not have a support layer capable of supporting the first outer layer circuit pattern, and thus there is a problem that the first outer layer circuit pattern may easily collapse due to various factors. Accordingly, in the embodiment, a support insulating layer capable of supporting the first outer layer circuit pattern positioned in the first region is formed.

An upper surface of the support insulating layer has a height equal to or lower than that of the first and second external circuit patterns on the outer insulating layer.

Accordingly, in the embodiment, it is possible to solve problems such as collapsing or rubbing of the protruding first outer layer circuit pattern by making the outer layer circuit pattern fine, thereby improving product reliability. In particular, in the embodiment, it is possible to solve problems such as collapsing or rubbing of the outer layer circuit pattern on the first region where the solder resist is not disposed, thereby improving the product reliability.

In addition, in the embodiment, in removing the support insulating layer, a physical method such as sand blasting is used instead of a chemical method such as plasma. Accordingly, when the support insulating layer is removed by plasma, a residual resin may remain on a surface of the outer layer circuit pattern, and accordingly, an additional process of removing the residual resin should be performed. In this case, in order to remove the residual resin, the surface of the outer layer circuit pattern should be etched, and accordingly, the outer layer circuit pattern may be deformed. For example, when the outer layer circuit pattern is etched, a cross-section of the outer layer circuit pattern may have a triangular shape. In addition, when the cross-section of the outer layer circuit pattern has the triangular shape, an adhesive member may not be stably disposed on the outer layer circuit pattern, thereby occurring a reliability problem. In contrast, in the embodiment, in removing the support insulating layer, the surface of the outer layer circuit pattern is exposed through a physical method such as sand blasting or a sanding method. In addition, when the support insulating layer is removed by the sand blasting and the sanding method, it is possible to align an upper surface of the supporting layer and an upper surface of the outer layer circuit pattern at substantially the same height, and furthermore, a shape of the upper surface of the support insulating layer may be controlled to a desired shape. Accordingly, in the embodiment, the adhesive member may be stably disposed on the outer layer circuit pattern while maintaining a quadrangular shape of the cross-sectional shape of the outer layer circuit pattern, thereby improving reliability.

In addition, in an embodiment, the shape or a surface area of the upper surface of the support insulating layer may be controlled by adjusting a sand blasting process condition for removing the support insulating layer. Specifically, in the embodiment, the shape or the surface area of the upper surface of the support insulating layer may be controlled by adjusting at least one of a moving speed of the circuit board moving on a sand blasting device, an ejection pressure of an abrasive and a moving speed of a nozzle that ejects the abrasive. That is, in the embodiment, an outer region of the upper surface of the support insulating layer has a height higher than that of an inner region by adjusting the moving speed or the ejection pressure. For example, in the embodiment, the upper surface of the support insulating layer may have a concave shape in which the outer region has a first height and the inner region has a second height that is lower than the first height. That is, in the embodiment, the upper surface of the support insulating layer may have different heights depending on a position. That is, the upper surface of the support insulating layer may include a highest portion having the highest height and a lowest portion having the lowest height. In addition, the highest portion may be positioned adjacent to the outer layer circuit pattern, and the lowest portion may be positioned farther from the outer layer circuit pattern compared to the highest portion. Accordingly, in the embodiment, the shape of the upper surface of the support insulating layer may have the concave shape to increase the surface area of the upper surface of the support insulating layer. Accordingly, it is possible to increase a contact surface with the solder resist disposed on the support insulating layer, thereby improving bonding force between the support insulating layer and the solder resist.

In addition, the circuit board in the embodiment can be applied to a 5G communication system, and accordingly, transmission loss of a high frequency can be minimized, thereby further improving the reliability. Specifically, the circuit board in the embodiment can be used at the high frequency and can reduce wave loss.

DESCRIPTION OF DRAWINGS

FIGS. 1A and 1B are views showing a circuit board manufactured by an SAP method according to Comparative example.

FIG. 2 is a view showing a circuit board manufactured by a ETS method in Comparative example.

FIG. 3 is a view showing a circuit board according to an embodiment.

FIG. 4A is an enlarged view of region B of FIG. 3.

FIG. 4B is an enlarged view of region C of FIG. 4A.

FIG. 5 is a plan view showing a portion of region B of FIG. 3.

FIGS. 6 to 15 are views showing a method of manufacturing the circuit board shown in FIG. 3 in order of process.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, embodiments of the present invention will be described in detail with reference to the accompanying drawings.

Prior to descriptions of the present embodiment, Comparative example compared with the present embodiment will be described.

FIG. 1 is a view showing a circuit board according to Comparative example.

Referring to FIG. 1A, the circuit board according to Comparative example includes a circuit pattern manufactured by a general SAP method.

Specifically, the circuit board includes an insulating layer 10, a circuit pattern 20, and a protective layer 30.

The circuit pattern 20 is respectively disposed on upper and lower surfaces of the insulating layer 10.

In this case, at least one of the circuit patterns 20 disposed on a surface of the insulating layer 10 includes a fine circuit pattern.

In FIG. 1, the circuit pattern 20 disposed on the upper surface of the insulating layer 10 includes a fine circuit pattern. The fine circuit pattern includes a trace 21 that is a signal transmission wiring line and a pad 22 for mounting a chip and the like.

In this case, in the embodiment, since a supporting layer using a solder resist is formed for protecting the fine circuit pattern, a structure in a region where the fine circuit pattern is formed in Comparative example will be described.

In addition, a protective layer 30 for protecting the circuit pattern 20 is disposed on the surface of the insulating layer 10.

In this case, an upper region of the insulating layer 10 includes a first region where the protective layer 30 is disposed and a second region that is an open region where the protective layer 30 is not disposed.

Accordingly, a part of the circuit pattern 20 disposed on the upper surface of the insulating layer 10 is covered by the protective layer 30, and the remaining part is exposed to the outside without being covered by the protective layer 30.

In this case, the trace 21 and the pad 22 corresponding to the fine circuit pattern as described above are disposed in the second region that is the open region of the protective layer 30.

For example, at least one of the trace 21 and the pad 22 is formed in a width/interval of 15 µm/15 µm or less.

In this case, when the circuit pattern formed in the open region of the protective layer 30 is a pattern having a width exceeding 15 µm rather than a fine circuit pattern, the circuit pattern may be strong against external impact.

However, as shown in FIG. 1 B, as the circuit pattern gradually becomes finer, the width and interval of the trace 21 and the pad 22, which are the fine circuit patterns of the outermost layer, gradually decrease, and accordingly, when the fine circuit pattern protruding above the upper surface of the insulating layer 10 is disposed in the second region that is the open region of the protective layer, there is a problem that the fine circuit pattern easily collapses due to an external impact.

That is, as in B of FIG. 1B, the trace 21 corresponding to the fine circuit pattern of the outermost layer has an extremely fine pattern shape, and thus a problem of easily collapsing or rubbing occurs even with a small external impact.

Meanwhile, recently, the fine circuit pattern disposed in the open region of the protective layer while having a structure buried in the insulating layer is formed by using a ETS method.

FIG. 2 is a view showing a circuit board manufactured by the ETS method in Comparative example.

Referring to FIG. 2, specifically, the circuit board includes an insulating layer 10A, a circuit pattern 20A, and a protective layer 30A.

The circuit pattern 20A is respectively disposed on upper and lower surfaces of the insulating layer 10A.

In this case, at least one of the circuit patterns 20A disposed on a surface of the insulating layer 10A includes a fine circuit pattern.

Here, when the circuit pattern is formed by the ETS method, the circuit pattern formed at first has a structure buried in the insulating layer 10A. Accordingly, when the circuit pattern formed at first is formed as a fine circuit pattern, the fine circuit pattern may have a structure in which the fine circuit pattern is buried in the insulating layer 10A even in Comparative example.

That is, the circuit board manufactured by the ETS method includes a fine circuit pattern having a structure buried in the surface of the insulating layer 10A. That is, the fine circuit pattern includes a trace 21A that is a signal transmission wiring line and a pad 22A for mounting a chip or the like.

In addition, when the circuit board is manufactured by the ETS method as described above, since the fine circuit pattern has the structure buried in the insulating layer, the fine circuit pattern may be protected from an external impact.

In this case, for a substrate having a two-layer structure (based on the number of layers of the circuit pattern) as in FIG. 2, there is no major problem in manufacturing the circuit board by the ETS method. However, in case of manufacturing a circuit board having eight or more layers, in particular, ten or more layers by the ETS method, a lead time for manufacturing the same takes at least 2 months or more, and thus there is a problem that productivity is lowered.

In addition, in order to manufacture the fine circuit pattern of the buried structure by the ETS method, the fine circuit pattern should be formed at first during a manufacturing process of a multilayer circuit board. In addition, recently, in order to be applied to an AP module having high integration/high specification, etc., a circuit board having eight to ten layers are required. In this case, in a process of forming the fine circuit pattern at first during the ETS process and then performing a multilayer stacking process, damage is applied to the fine circuit pattern due to a thermal stress, etc., and thus there is a problem that it is difficult to normally implement the fine circuit pattern.

In addition, when the circuit board is manufactured by the ETS method, an ETS core layer is separately required. In this case, when the circuit board is manufactured by the ETS method, an additional process for finally removing the ETS core layer is required.

In addition, when the circuit board is manufactured by the ETS method, there is a problem that a yield is lowered due to a cumulative tolerance when layers are stacked more than a certain number of times, and accordingly, product costs increase, and there is a problem that pattern damage increases due to stress as the stacking process is respectively performed on both surfaces around the ETS core layer.

In addition, with the development of 5G technology in recent years, interest in circuit boards that may reflect the same is increasing. In this case, in order to apply the 5G technology, the circuit board should have a high multi-layer structure, and accordingly, the circuit pattern should be made fine. However, in Comparative example, it is possible to form the fine pattern, but there is a problem that it is not possible to stably protect the fine pattern.

Accordingly, the embodiment is directed to providing a circuit board of a new structure capable of solving the reliability problem of the fine pattern disposed at the outermost portion and a control method thereof.

Prior to descriptions of the circuit board of the present embodiment, the circuit board according to the embodiment may have a multilayer structure. Preferably, the circuit board according to the embodiment may have a structure of ten or more layers based on a number of layers of the circuit pattern. However, this is merely an example and the embodiment is not limited thereto. That is, the circuit board in the embodiment may have a number of layers smaller than ten layers, or alternatively, the circuit board may have a number of layers greater than ten layers.

However, the circuit board in the embodiment is for solving problems of the ETS method in Comparative example. In this case, the ETS method in Comparative example has a problem that it takes a lot of time to manufacture a circuit board having eight or more layers, and accordingly, in the embodiment, it will be described as having a ten-layer structure for comparison therewith.

FIG. 3 is a view showing a circuit board according to an embodiment, FIG. 4A is an enlarged view of region B of FIG. 3, FIG. 4B is an enlarged view of region C of FIG. 4A, and FIG. 5 is a plan view showing a portion of region B of FIG. 3.

Hereinafter, the circuit board according to the embodiment will be described in detail with reference to FIGS. 3 to 5.

Referring to FIGS. 3 to 5, a circuit board 100 includes an insulating layer 110.

Preferably, the circuit board 100 may include first to ninth insulating layers 111, 112, 113, 114, 115, 116, 117, 118, and 119 in order to implement a ten-layer structure.

In this case, the first insulating layer 111, the second insulating layer 112, the third insulating layer 113, the fourth insulating layer 114, the fifth insulating layer 115, the sixth insulating layer 116, and the seventh insulating layer 117 of the insulating layer 110 may be an internal insulating layer disposed inside in a stacked insulating layer structure, and the eighth insulating layer 118 may be an uppermost insulating layer(a first outermost insulating layer) disposed on an inner insulating layer, and the ninth insulating layer 119 may be a lowermost insulating layer (a second outermost insulating layer) disposed under the inner insulating layer.

The first insulating layer 111 may be a core insulating layer disposed at a center in the stacked structure of the insulating layer 110. The second insulating layer 112, the fourth insulating layer 114, the sixth insulating layer 116, and the eighth insulating layer 118 may be upper insulating layers sequentially disposed on the first insulating layer 111. In addition, the third insulating layer 113, the fifth insulating layer 115, the seventh insulating layer 117, and the ninth insulating layer 119 may be lower insulating layers sequentially disposed under the first insulating layer 111.

The insulating layer 110 may be a substrate on which an electric circuit capable of changing wiring is formed and may include all of a printed circuit board, a wiring board, and an insulating substrate made of an insulating material capable of forming circuit patterns on a surface thereof.

For example, the insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 110 may include an optically isotropic film. As an example, the insulating layer 110 may include cyclic olefin copolymer (COC), cyclic olefin polymer (COP), optically isotropic PC, optically isotropic polymethylmethacrylate (PMMA), or the like.

In addition, at least one of the insulating layer 110 may be partially bent while having a curved surface. That is, at least one of the insulating layer 110 may partially have a plane and may partially be bent while having a curved surface. Specifically, an end portion of at least one of the insulating layer 110 may be bent while having a curved surface, or bent or crooked while having a surface with a random curvature.

In addition, at least one of the insulating layer 110 may be a flexible substrate having flexibility. Further, at least one of the insulating layer 110 may be a curved or bent substrate. In this case, at least one of the insulating layer 110 may form a wiring layout for electrical wirings which connect circuit components based on a circuit design, and electrical conductors may be disposed on an insulating material. Further, electrical components may be mounted on at least one of the insulating layer 110, and the insulating layer 110 may form wirings configured to connect the electrical components to make a circuit, and may mechanically fix the components besides functioning to electrically connect the components.

A circuit pattern may be disposed on a surface of the insulating layer 110.

That is, circuit patterns may be disposed on respective surfaces of the first to ninth insulating layers 111, 112, 113, 114, 115, 116, 117, 118, and 119 constituting the insulating layer 110.

Here, the circuit pattern may include an inner layer circuit pattern 120 and outer layer circuit patterns 130 and 140. The inner layer circuit pattern 120 may be a circuit pattern disposed inside the insulating layer 110 in the stacked structure of the circuit board, and the outer layer circuit patterns 130 and 140 may be a circuit pattern disposed on an outermost side of the insulating layer 110 in the stacked structure of the circuit board.

The inner layer circuit pattern 120 may include a first circuit pattern 121, a second circuit pattern 122, a third circuit pattern 123, a fourth circuit pattern 124, a fifth circuit pattern 125, and a sixth circuit pattern 126, and a seventh circuit pattern 127.

The first circuit pattern 121 may be disposed on an upper surface of the first insulating layer 111, and thus the first circuit pattern 121 may be covered by the second insulating layer 112. The second circuit pattern 122 may be disposed on a lower surface of the first insulating layer 111, and thus the second circuit pattern 122 may be covered by the third insulating layer 113. The third circuit pattern 123 may be disposed on an upper surface of the second insulating layer 112, and thus the third circuit pattern 123 may be covered by the fourth insulating layer 114. The fourth circuit pattern 124 may be disposed on a lower surface of the third insulating layer 113, and thus the fourth circuit pattern 124 may be covered by the fifth insulating layer 115. The fifth circuit pattern 125 may be disposed on an upper surface of the fourth insulating layer 114, and thus the fifth circuit pattern 125 may be covered by the sixth insulating layer 116. The sixth circuit pattern 126 may be disposed on a lower surface of the fifth insulating layer 115, and thus the sixth circuit pattern 126 may be covered by the seventh insulating layer 117. The seventh circuit pattern 127 may be disposed on an upper surface of the sixth insulating layer 116, and thus the seventh circuit pattern 127 may be covered by the eighth insulating layer 118. The eighth circuit pattern 128 may be disposed on a lower surface of the seventh insulating layer 117, and thus the eighth circuit pattern 128 may be covered by the ninth insulating layer 119.

The outer layer circuit pattern may be disposed on a surface of the outermost insulating layer disposed on the outermost side of the insulating layer 110. Preferably, the outer layer circuit pattern may include a first outer layer circuit pattern 130 disposed on a lower surface of the ninth insulating layer 119 disposed at a lowermost portion of the insulating layer 110.

In addition, the outer layer circuit pattern may include a second outer layer circuit pattern 140 disposed on an upper surface of the eighth insulating layer 118 disposed on an uppermost portion of the insulating layer 110.

In this case, at least one of the first outer layer circuit pattern 130 and the second outer layer circuit pattern 140 may be formed to protrude above the surface of the insulating layer. Preferably, the first outer layer circuit pattern 130 may be formed to protrude below the lower surface of the ninth insulating layer 119. In addition, the second outer layer circuit pattern 140 may be formed to protrude above the upper surface of the eighth insulating layer 118.

That is, an upper surface of the first outer layer circuit pattern 130 may be positioned on the same plane as the lower surface of the ninth insulating layer 119. In addition, a lower surface of the second outer layer circuit pattern 140 may be positioned on the same plane as an upper surface of the primer layer 150 disposed on an upper surface of the eighth insulating layer 118.

In other words, the primer layer 150 may be disposed on the upper surface of the eighth insulating layer 118 and the second outer layer circuit pattern 140.

That is, the second outer layer circuit pattern 140 may include a fine circuit pattern. Preferably, the second outer layer circuit pattern 140 may be a fine circuit pattern having a line width of 10 μm or less and an interval between patterns of 10 μm or less. Accordingly, when the second outer layer circuit pattern 140 is directly disposed on the eighth insulating layer 118, a contact area between the eighth insulating layer 118 and the second outer layer circuit pattern 140 is small, and thus a situation in which the second outer layer circuit pattern 140 is separated from the eighth insulating layer 118 may occur.

Therefore, in the embodiment, the primer layer 150 is disposed between the second outer layer circuit pattern 140 and the eighth insulating layer 118. The primer layer 150 may improve bonding force between the second outer layer circuit pattern 140 and the eighth insulating layer 118. The primer layer 150 may be disposed to entirely cover the upper surface of the eighth insulating layer 118. In addition, the second outer layer circuit pattern 140 may be partially disposed on the primer layer 150. Therefore, the upper surface of the primer layer 150 in a first embodiment may include a first portion in contact with the second outer layer circuit pattern 140 and a second portion in contact with a lower surface of a support insulating layer 160 to be described later. That is, when the second outer layer circuit pattern 140 by the SAP process is formed, the primer layer 150 may serve to strengthen bonding force between the eighth insulating layer 118 and the second outer layer circuit pattern 140. Such a primer layer 150 may include a polyurethane-based resin, an acrylic resin, or a silicone-based resin, but the embodiment is not limited thereto.

Meanwhile, it is illustrated in FIG. 3 that the primer layer is not disposed between the ninth insulating layer 119 and the first outer layer circuit pattern 130, but the primer layer may also be formed between the ninth insulating layer 119 and the first outer layer circuit pattern 130. However, the first outer layer circuit pattern 130 may not be the fine circuit pattern, and accordingly, the primer layer between the ninth insulating layer 119 and the first outer layer circuit pattern 130 may be selectively omitted.

Consequently, when the fine circuit pattern is disposed on the inner layer, the primer layer may be omitted as the circuit pattern is covered by at least one of the insulating layers 110. On the other hand, in the embodiment, when the fine circuit pattern is disposed on the outermost layer, since there is no insulating layer covering the fine circuit pattern, the primer layer 150 is disposed in order to improve bonding force between the fine circuit pattern and the insulating layer.

Hereinafter, it will be described that the second outer layer circuit pattern 140 is formed of a fine circuit pattern. However, the embodiment is not limited thereto, and the first outer layer circuit pattern 130 may also be formed of the fine circuit pattern. It will be obvious that a structure for improving reliability, such as strengthening bonding force and preventing collapse of the second outer layer circuit pattern 140 described below, may also be applied to the first outer layer circuit pattern 130.

The inner layer circuit pattern 120, the first outer layer circuit pattern 130, and the second outer layer circuit pattern 140 may be wirings that transmit electrical signals and may be formed of a metal material having high electrical conductivity. To this end, the inner circuit pattern 120, the first outer layer circuit pattern 130, and the second outer layer circuit pattern 140 may be formed of at least one metal material selected from among gold (Au), silver (Ag), platinum (Pt), titanium (Ti), tin (Sn), copper (Cu), and zinc (Zn). In addition, the inner circuit pattern 120, the first outer layer circuit pattern 130, and the second outer layer circuit pattern 140 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the inner circuit pattern 120, the first outer layer circuit pattern 130, and the second outer layer circuit pattern 140 may be formed of copper (Cu) having high electrical conductivity and a relatively low cost.

At least one of the inner layer circuit pattern 120, the first outer layer circuit pattern 130, and the second outer layer circuit pattern 140 may be formed by a general process of manufacturing a circuit board, such as an additive process, a subtractive process, a modified semi additive process (MSAP), a semi additive process (SAP), etc., and detailed descriptions thereof will be omitted herein.

Preferably, the first outer layer circuit pattern 130 and the second outer layer circuit pattern 140 are outermost circuit patterns disposed on the outermost side of the circuit board, and thus they may be formed by the SAP (Semi Additive Process) method.

Meanwhile, a via V may be disposed in the insulating layer 110. The vias V are disposed in each insulating layer, and thus the via V may serve to electrically connect circuit patterns disposed in different layers to each other.

A first via V1 may be disposed in the first insulating layer 111. The first via V1 may electrically connect the first circuit pattern 121 disposed on the upper surface of the first insulating layer 111 and the second circuit pattern 122 disposed on the lower surface of the first insulating layer 111.

A second via V2 may be disposed in the second insulating layer 112. The second via V2 may electrically connect the first circuit pattern 121 disposed on the upper surface of the first insulating layer 111 and the third circuit pattern 123 disposed on the upper surface of the second insulating layer 112.

A third via V3 may be disposed in the third insulating layer 113. The third via V3 may electrically connect the second circuit pattern 122 disposed on the lower surface of the first insulating layer 111 and the fourth circuit pattern 124 disposed on the lower surface of the third insulating layer 113.

A fourth via V4 may be disposed in the fourth insulating layer 114. The fourth via V4 may electrically connect the third circuit pattern 123 disposed on the upper surface of the second insulating layer 111 and the fifth circuit pattern 125 disposed on the upper surface of the fourth insulating layer 114.

A fifth via V5 may be disposed in the fifth insulating layer 115. The fifth via V5 may electrically connect the fourth circuit pattern 124 disposed on the lower surface of the third insulating layer 113 and the sixth circuit pattern 126 disposed on the lower surface of the fifth insulating layer 115.

A sixth via V6 may be disposed in the sixth insulating layer 116. The sixth via V6 may electrically connect the fifth circuit pattern 125 disposed on the upper surface of the fourth insulating layer 114 and the seventh circuit pattern 127 disposed on the upper surface of the sixth insulating layer 116.

A seventh via V7 may be disposed in the seventh insulating layer 117. The seventh via V7 may electrically connect the sixth circuit pattern 126 disposed on the lower surface of the fifth insulating layer 115 and the eighth circuit pattern 128 disposed on the lower surface of the seventh insulating layer 117.

An eighth via V1 may be disposed in the eighth insulating layer 118. The eighth via V8 may electrically connect the seventh circuit pattern 127 disposed on the upper surface of the sixth insulating layer 116 and the second outer layer circuit pattern 140 disposed on the upper surface of the primer layer 150.

A ninth via V9 may be disposed in the ninth insulating layer 119. The ninth via V9 may electrically connect the eighth circuit pattern 128 disposed on the lower surface of the seventh insulating layer 117 and the first outer layer circuit pattern 130 disposed on the lower surface of the ninth insulating layer 119.

The via V as described above may be formed by filling the inside of a via hole formed in each insulating layer with a metal material.

The via hole may be formed by any one of mechanical, laser, and chemical processing method. When the via hole is formed by mechanical processing, a method such as milling, drilling and routing may be used, when the via hole is formed by laser processing, a method of UV or $CO_2$ laser may be used, and when the via hole is formed by chemical processing, the insulating layer 110 may be opened using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the through-hole is formed, the first to ninth vias V1, V2, V3, V4, V5, V6, V7, V8, and V9 may be formed by filling the inside of the through-hole with a conductive material. The metal material forming the first to ninth vias V1, V2, V3, V4, V5, V6, V7, V8, and V9 may be any one material selected from among copper (Cu), silver (Ag), tin (Sn), gold (Au), nickel (Ni), and palladium (Pd), and the conductive material may be filled by any one of electroless plating, electrolytic plating, screen printing, sputtering, evaporation, ink jetting, and dispensing, or a combination thereof.

Meanwhile, a protective layer may be disposed on an outermost side of the circuit board 100. Preferably, a first protective layer 170 may be disposed on the eighth insulating layer 118 (preferably, on the primer layer 150). In addition, a second protective layer 175 may be disposed under the ninth insulating layer 119.

The first protective layer 170 and the second protective layer 175 may be formed of at least one layer using any one or more of solder resist (SR), oxide, and Au. Preferably, the protective layer 150 may be a solder resist.

Meanwhile, a support layer 160 is disposed on the primer layer 150. The support layer 160 may serve to support the second outer layer circuit pattern 140 disposed on the primer layer 150.

That is, the first protective layer 170 may partially overlap the second outer layer circuit pattern 140 disposed on the primer layer 150. An area of the first protective layer 170 may be smaller than an area of the eighth insulating layer 118. The area of the first protective layer 170 may be smaller than an area of the primer layer 150. The first protective layer 170 is partially disposed on the primer layer 150 and the second outer layer circuit pattern 140, and thus the first protective layer 170 may include a first region R1 corresponding to an open region thereof.

That is, an upper region of the eighth insulating layer 118 in the embodiment may include the first region R1 and a second region R2. In addition, the first region R1 corresponds to the open region of the first protective layer 170, and accordingly, the first protective layer 170 may not be disposed in the first region R1. In addition, the second region R1 is a region where the first protective layer 170 is disposed, and accordingly, the second outer layer circuit pattern 140 positioned in the second region R2 may be covered by the first protective layer 170. That is, a surface of the second outer layer circuit pattern positioned in the first region R1 may be exposed to the outside, and a surface of the second outer layer circuit pattern positioned in the second region R2 may be covered by the first protective layer 170.

Specifically, the first protective layer 170 includes a hole-shaped open region. That is, the open region of the first protective layer 170 may vertically overlap the first region R1 to expose the first region R1.

The first region R1 may be a region (i.e., the open region of the first protective layer) where the first protective layer 170 is not disposed among upper regions of the primer layer 150 and the second outer layer circuit pattern 140.

That is, the first region R1 may be the non-disposed region of the first protective layer 170 for electrically connecting the second outer layer circuit pattern 140 to a component such as a chip. Accordingly, the second outer layer circuit pattern 140 disposed on the first region R1 may be exposed to the outside in a state in which the protective layer protecting the same does not exist.

In addition, the second outer layer circuit pattern 140 disposed in the first region R1 as described above may have a reliability problem such as collapsing or rubbing due to various factors. Furthermore, the second outer layer circuit pattern 140 is a fine circuit pattern, and thus the second outer layer circuit pattern 140 has a line width of 10 μm or less and an interval of 10 μm or less and is disposed on the primer layer 150. Accordingly, the second outer layer circuit pattern 140 disposed on the open region R1 may have a problem that it is easily collapsed or rubbed by various small external impacts.

Accordingly, in the embodiment, in order to improve reliability of the second outer layer circuit pattern 140 disposed on the first region R1, the support layer 160 is formed on the primer layer 150 corresponding to the first region R1. That is, the support layer 160 may be disposed in a region of the upper surface of the primer layer 150 where the second outer layer circuit pattern 140 is not disposed. For example, the support layer 160 may be disposed on the upper surface of the primer layer 150, and thus the support layer 160 may be disposed between the second outer layer circuit patterns 140 on the first region R1. Here, the support layer 160 may also be referred to as a support insulating layer.

In this case, the second outer layer circuit pattern 140 includes a 2-1 outer layer circuit pattern 140-1 formed on the open region R1 in which the first protective layer 170 is not disposed and a 2-2 second outer layer circuit pattern 140-2 formed on the second region R2 in which the first protective layer 170 is disposed.

In addition, the upper surface of the primer layer 150 includes a first the upper surface corresponding to the first region R1 and a second the upper surface corresponding to the second region R2.

In this case, as shown in FIGS. 3 to 5, the support layer 160 may be entirely disposed on the primer layer 150 without dividing the first region R1 and the second region R2 and may be respectively disposed in a region between the 2-1 outer layer circuit patterns 140-1 and a region between the 2-2 outer layer circuit patterns 140-2.

That is, since the 2-2 outer layer circuit patterns 140-2 disposed in the second region R2 are supported and protected by the first protective layer 170, there is a low possibility that problems such as collapsing or rubbing occur. However, in the embodiment, in order to improve bonding force of the first protective layer 170 disposed in the second region R2, the support layer 160 is formed in the second region R2.

Furthermore, in the embodiment, in order to increase a bonding area between the first protective layer 170 and the support layer 160 disposed on the second region R2, a shape of an upper surface of the support layer 160 is changed. For example, the upper surface of the support layer 160 in the embodiment may have a curved surface rather than a flat surface. In addition, a surface area of the curved surface is greater than a surface area of the flat surface, and accordingly, the upper surface of the support layer 160 is formed as a curved surface to increase the bonding area with the first protective layer 170, thereby improving bonding force. This will be described in detail below.

The support layer 160 includes a first portion disposed in the first region R1 and a second portion disposed in the second region R2.

In addition, the first protective layer 170 may be disposed on the second portion of the support layer 160 positioned in the second region R2 and the 2-2 second outer layer circuit patterns.

In this case, at least a part of the upper surface of the support layer 160 may be positioned lower than an upper surface of the second outer layer circuit pattern 140. For example, the upper surface of the support layer 160 may include at least one concave portion positioned lower than the upper surface of the second outer layer circuit pattern 140.

In addition, the first protective layer 170 is disposed on the support layer 160 and the second outer layer circuit pattern 140. In this case, the first protective layer 170 may be disposed to fill the concave portion of the support layer 160. Therefore, in the embodiment, at least a part of a lower surface of the first protective layer 170 may be positioned lower than the upper surface of the second outer layer circuit pattern 140. In addition, at least a part of the lower surface of the first protective layer 170 may be positioned lower than at least a part of the upper surface of the support layer 160. Accordingly, in the embodiment, the bonding area between the upper surface of the support layer 160 and the lower surface of the first protective layer 170 may be increased, thereby improving the bonding force between the support layer 160 and the first protective layer 170.

Hereinafter, the first protective layer 170 will be described in detail.

In the embodiment, the support layer 160 surrounding a periphery of the second outer layer circuit pattern 140 and in direct contact with a side surface of the second outer layer circuit pattern 140 is formed on the primer layer 150. In addition, in the embodiment, the second outer layer circuit pattern 140 of the fine circuit pattern may be supported by the support layer 160. Preferably, in the embodiment, the second outer layer circuit pattern 140 disposed in the open region R1 of the protective layer 170 may be supported by the support layer 160, and accordingly, the second outer layer circuit pattern 140 may be stably protected from external impact.

Meanwhile, the second outer layer circuit pattern 140 may include a trace 141 and a pad 142 according to a function. The pad 142 may be a region where an adhesive member (not shown) is disposed for connection with an electronic component such as a chip. In addition, the trace 141 may be a wiring line connecting between different pads. Here, generally, the pad 142 has a width greater than that of the trace, and accordingly, the pad 142 may have characteristics strong against external impact. However, the trace 141 is disposed to have a width and an interval corresponding to the fine circuit pattern as described above, and accordingly, the trace 141 may be weak against external impact. Therefore, the support layer 160 may serve to stably support the second outer layer circuit pattern 140 disposed in the first region R1, and more particularly, the trace 141 of the second outer layer circuit pattern 140 in the first region R1.

Meanwhile, as shown in FIG. 4A, the second outer layer circuit pattern 140 may be disposed to have a first height H1 on the primer layer 150.

In addition, the support layer 160 may be disposed to have a second height H2 on the primer layer 150. In this case, the second height H2 may be different depending on the position. That is, the upper surface of the support layer 160 may be a curved surface rather than a flat surface, a rounded surface, or an uneven surface.

In addition, the first protective layer 170 may be disposed to have a second height H2 on the support layer 160 and the second outer layer circuit pattern 140. In this case, the second height H2 may have a range of 7 µm to 20 µm. In this case, when the second height H2 is less than 7 µm, the second outer layer circuit pattern 140 may not be stably protected by the first protective layer 170. In addition, when the second height H2 is greater than 20 µm, a thickness of the circuit board may increase.

In this case, the first protective layer 170 includes a portion having a lower surface lower than the upper surface of the second outer layer circuit pattern 140.

That is, the first protective layer 170 may include a first portion disposed on the second outer layer circuit pattern 140 and a second portion disposed on the support layer 160 in the second region R2.

In addition, the first portion of the first protective layer 170 may have the second height H2 as the first portion is disposed on the second outer layer circuit pattern 140.

However, the second portion of the first protective layer 170 may be disposed on the support layer 160. In this case, the support layer 160 may include a concave portion in which the upper surface is not a flat surface. Accordingly, at least a part of a lower surface of the second portion of the first protective layer 170 may be positioned lower than a lower surface of the first portion. That is, at least a part of the lower surface of the second portion of the first protective layer 170 may be positioned lower than the upper surface of the second outer layer circuit pattern 140. In this case, for example, a lowest portion of the lower surface of the second portion of the first protective layer 170 may be positioned as low as a third height H3 from the upper surface of the second outer layer circuit pattern 140. The third height H3 may be determined by a height of the upper surface of the support layer 160.

In this case, the third height H3 may have a level of 20% to 50% of the first height H1 of the second outer layer circuit pattern 140. When the third height H3 is smaller than 20% of the first height H1, the bonding area between the first protective layer 170 and the support layer 160 is small, so that bonding force may decrease. In addition, when the third height H3 is greater than 50% of the first height H1, the second outer layer circuit pattern 140 may not be stably supported by the support layer 160. For example, the support layer 160 is also formed in the first region R1. In this case, the height of the upper surface of the support layer 160 in the first region R1 and the second region R2 may have a similar level. Here, the fact that the third height H3 is greater than 50% of the first height H1 may refer that a height of a lowest portion of the upper surface of the support layer 160 is smaller than 50% of the first height H1. In addition, when the height of the lowest portion having a lowest height of the upper surface of the support layer 160 is smaller than 50% of the first height H1, the support effect of the second outer layer circuit pattern 140 by the support layer 160 is insufficient, and thus there is a problem that the second outer layer circuit pattern 140 may not be stably supported. Therefore, the lowest portion of the lower surface of the second portion of the first protective layer 170 has a level of 20% to 50% of the first height H1 of the second outer layer circuit pattern 140.

As described above, in the embodiment, the first protective layer 170 is disposed in the second region R2. In this case, the first protective layer 170 includes the first portion disposed on the outer layer circuit pattern 140 of the second region R2 and the second portion disposed on the support layer 160. In this case, an upper surface of the first portion and an upper surface of the second portion of the first protective layer 170 may be positioned on the same plane. However, the lower surface of the first portion of the first protective layer 170 may be positioned on a different plane from at least a part of the lower surface of the second portion. That is, at least a part of the lower surface of the second portion of the first protective layer 170 may be positioned lower than the lower surface of the first portion of the first protective layer 170. In addition, the lowest portion of the lower surface of the second portion of the first protective layer 170 has 20% to 50% of the first height H1 of the second outer layer circuit pattern 140.

Accordingly, in the embodiment, the bonding area between the support layer 160 and the first protective layer 170 may effectively increased while the second outer layer circuit pattern 140 is stably supported by the support layer 160.

Hereinafter, the support layer 160 will be described in detail.

The support layer 160 may be disposed on the primer layer 150.

Preferably, the support layer 160 may be disposed between the second outer layer circuit patterns 140 on the primer layer 150. That is, the second outer layer circuit patterns 140 may be disposed on the primer layer 150 to be spaced apart from each other at a predetermined interval, and accordingly, the support layer 160 may be disposed on a region of the upper surface of the primer layer where the second outer layer circuit pattern 140 is not disposed.

Accordingly, the support layer 160 may have a structure in direct contact with the second outer layer circuit pattern 140. For example, a side surface of the support layer 160 may be in direct contact with the side surface of the second outer layer circuit pattern 140.

That is, the support layer 160 is disposed to surround the periphery of the second outer layer circuit pattern 140, and accordingly, it is possible to serve to prevent the second outer layer circuit pattern 140 from collapsing or rubbing.

The support layer 160 may have a structure in which a resin and a filler are mixed. That is, the support layer 160 may be an insulating layer without ABF, RCC, or other glass fibers. However, the embodiment is not limited thereto, and the support layer 160 may be made of PID that is a photosensitive insulating material.

In the embodiment, as described above, the support layer 160 surrounding the periphery of the second outer layer circuit pattern 140 and in direct contact with the side surface of the second outer layer circuit pattern 140 is formed on the primer layer 150. In addition, in the embodiment, the second outer layer circuit pattern 140 of the fine circuit pattern may be supported by the support layer 160. Preferably, in the embodiment, the second outer layer circuit pattern 140 disposed in the open region R1 of the protective layer 170 may be supported by the support layer 160, and accordingly, the second outer layer circuit pattern 140 may be stably protected from external impact.

Meanwhile, the second outer layer circuit pattern 140 may include a trace 141 and a pad 142 according to a function. The pad 142 may be a region where an adhesive member (not shown) is disposed for connection with an electronic component such as a chip. In addition, the trace 141 may be a wiring line connecting between different pads. Here, generally, the pad 142 has a width greater than that of the trace, and accordingly, the pad 142 may have characteristics strong against external impact. However, the trace 141 is disposed to have a width and an interval corresponding to the fine circuit pattern as described above, and accordingly, the trace 141 may be weak against external impact. Therefore, the support layer 160 may serve to stably support the second outer layer circuit pattern 140 disposed in the first region R1, and more particularly, the trace 141 of the second outer layer circuit pattern 140 in the first region R1.

Meanwhile, as shown in FIG. 4B, the upper surface of the support layer 160 may be a rounded curved surface rather than a flat surface.

Accordingly, the height of the upper surface of the support layer 160 may be different depending on the position. That is, the upper surface of the support layer 160 may have a fourth height H4 at a first position and a fifth height H5 smaller than the fourth height H4 at a second position.

The fourth height H4 may be a height of a highest portion 161 having a highest height of the upper surfaces of the support layer 160.

In addition, the fifth height H5 may be a height of a lowest portion 162 having a lowest height of the upper surfaces of the support layer 160.

The fourth height H4 may be a height of a part of an upper surface positioned in an edge region of the upper surface of the support layer 160. For example, the fourth height H4 may be a height of an edge portion of the upper surface of the support layer 160. That is, the upper surface of the support layer 160 may have a greater height as it approaches the second outer layer circuit pattern 140 and may have a smaller height as it goes away from the second outer layer circuit pattern 140. As an example, it is possible to have a highest fourth height H4 in the edge region of the upper surface of the support layer 160, and to have a lowest fifth height H5 in a central region of the upper surfaces of the support layer 160, but the embodiment is not limited thereto. However, the highest portion 161 having the fourth height H4 may be positioned adjacent to the second outer layer circuit pattern 140 compared to the lowest portion 162.

The fourth height H4 may be greater than the fifth height H5. Therefore, the upper surface of the support layer 160 may have a lower height from the highest part 161 toward the lowest part 162. That is, the upper surface of the support layer 160 may be a rounded curved surface of which height decreases from the highest part 161 toward the lowest part 162.

The fourth height H4 may not be greater than the first height H1. Preferably, the fourth height H4 may be equal to or smaller than the first height H1. More preferably, the fourth height H4 may have a range of 90% and 100% of the first height H1. When the fourth height H4 is greater than 100% of the first height H1, a part of the support layer 160 may cover the second outer layer circuit pattern 140, and thus a reliability problem may occur. In addition, when the fourth height H4 is smaller than 90% of the first height H1, the second outer layer circuit pattern 140 may not be stably supported by the support layer 160, or a synergistic effect of the bonding area between 160 and the first protective layer 170 may be insignificant.

The fifth height H5 may be smaller than the fourth height H4. For example, the fifth height H5 may be 80% to 90% of the fourth height H5.

The fifth height H5 may be determined by the first height H1. That is, when a difference between the fifth height H5 and the first height H1 is small, the synergistic effect of the bonding area is insignificant, and when the difference is large, a supporting effect of the pattern 140 may be reduced.

Accordingly, in the embodiment, the fifth height H5 may be 50% to 90% of the first height H1. That is, the fifth height H5 may be smaller than the fourth height H4 and may be 50% to 90% of the first height H1.

When the fifth height H5 is smaller than 50% of the first height H1, the fourth height H4 may also be reduced, and thus the second outer layer circuit pattern 140 may not be stably supported by the support layer 160, thereby causing a reliability problem. In addition, when the fifth height H5 is greater than 90% of the first height H1, the upper surface of the support layer 160 is substantially close to a plane, and thus the bonding area and bonding force between the support layer 160 and the first protective layer 170 may be reduced. Therefore, in the embodiment, the highest portion 161 having the highest height of the support layer 160 is smaller than the fourth height H4 and has the fifth height H5 having a level of the range of 50% to 90% of the first height H1.

Meanwhile, in the embodiment, a difference H6 between the fourth height H4 and the fifth height H5 may have a level of a range of 10% to 20% of the first height H1 of the second outer layer circuit pattern 140. For example, the first height H1 of the second outer layer circuit pattern 140 may be 15 μm, and the difference H6 between the fourth height H5 and the fifth height H5 is 2 μm to 3 μm.

As described above, in the embodiment, the upper surface of the support layer 160 may include the highest portion 161 having the highest height and the lowest portion 162 having the lowest height. In addition, the highest portion 161 may be positioned adjacent to the second outer layer circuit pattern 140 compared to the lowest portion 162.

In addition, the fifth height H5 of the highest portion 161 has the level in the range of 50% to 90% of the first height H1, and thus the second outer layer circuit pattern 140 may be stably supported by the support layer 160 and the bonding area between the support layer 160 and the first protective layer 170 may be increased.

In addition, as in FIG. 5, in the circuit board 100 in the embodiment, the primer layer 150 is disposed on the eighth insulating layer 118, and the second outer layer circuit pattern 140 is disposed on the primer layer 150.

In addition, the support layer 160 disposed to surround the periphery of the second outer layer circuit pattern 140 is disposed on the primer layer 150.

In this case, the support layer 160 may be respectively formed in the open region R1 where the first protective layer 170 is not disposed and a protective layer arrangement region R2 where the first protective layer 170 is disposed.

The support layer 160 may support the second outer layer circuit pattern 140 disposed on an outermost layer of the circuit board 100, and in particular, the support layer 160 may protect the second outer layer circuit pattern 140 from external impact by supporting the trace 141 and the pad 142 of the second outer layer circuit pattern 140 disposed in the open region R1.

The circuit board in the embodiment is a circuit board a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern positioned in a first region where a solder resist (SR) is not disposed among an upper region of the outer insulating layer and a second outer layer circuit pattern positioned in a second region where the solder resist is disposed. In this case, the second outer layer circuit pattern may be supported by the solder resist, but the first outer layer circuit pattern does not have a support layer capable of supporting the first outer layer circuit pattern, and thus there is a problem that the first outer layer circuit pattern may easily collapse due to various factors. Accordingly, in the embodiment, a support insulating layer capable of supporting the first outer layer circuit pattern positioned in the first region is formed.

An upper surface of the support insulating layer has a height equal to or lower than that of the first and second external circuit patterns on the outer insulating layer.

Accordingly, in the embodiment, it is possible to solve problems such as collapsing or rubbing of the protruding first outer layer circuit pattern by making the outer layer circuit pattern fine, thereby improving product reliability. In particular, in the embodiment, it is possible to solve problems such as collapsing or rubbing of the outer layer circuit pattern on the first region where the solder resist is not disposed, thereby improving the product reliability.

In addition, in the embodiment, in removing the support insulating layer, a physical method such as sand blasting is used instead of a chemical method such as plasma. Accordingly, when the support insulating layer is removed by plasma, a residual resin may remain on a surface of the outer layer circuit pattern, and accordingly, an additional process of removing the residual resin should be performed. In this case, in order to remove the residual resin, the surface of the outer layer circuit pattern should be etched, and accordingly, the outer layer circuit pattern may be deformed. For example, when the outer layer circuit pattern is etched, a cross-section of the outer layer circuit pattern may have a triangular shape. In addition, when the cross-section of the outer layer circuit pattern has the triangular shape, an adhesive member may not be stably disposed on the outer layer circuit pattern, thereby occurring a reliability problem. In contrast, in the embodiment, in removing the support insulating layer, the surface of the outer layer circuit pattern is exposed through a physical method such as sand blasting or a sanding method. In addition, when the support insulating layer is removed by the sand blasting and the sanding method, it is possible to align an upper surface of the supporting layer and an upper surface of the outer layer circuit pattern at substantially the same height, and furthermore, a shape of the upper surface of the support insulating layer may be controlled to a desired shape. Accordingly, in the embodiment, the adhesive member may be stably disposed on the outer layer circuit pattern while maintaining a quadrangular shape of the cross-sectional shape of the outer layer circuit pattern, thereby improving reliability.

In addition, in an embodiment, the shape or a surface area of the upper surface of the support insulating layer may be controlled by adjusting a sand blasting process condition for removing the support insulating layer. Specifically, in the embodiment, the shape or the surface area of the upper surface of the support insulating layer may be controlled by adjusting at least one of a moving speed of the circuit board moving on a sand blasting device, an ejection pressure of an abrasive and a moving speed of a nozzle that ejects the abrasive. That is, in the embodiment, an outer region of the upper surface of the support insulating layer has a height higher than that of an inner region by adjusting the moving speed or the ejection pressure. For example, in the embodiment, the upper surface of the support insulating layer may have a concave shape in which the outer region has a first height and the inner region has a second height that is lower than the first height. That is, in the embodiment, the upper surface of the support insulating layer may have different heights depending on a position. That is, the upper surface of the support insulating layer may include a highest portion having the highest height and a lowest portion having the lowest height. In addition, the highest portion may be positioned adjacent to the outer layer circuit pattern, and the lowest portion may be positioned farther from the outer layer circuit pattern compared to the highest portion. Accordingly, in the embodiment, the shape of the upper surface of the support insulating layer may have the concave shape to increase the surface area of the upper surface of the support insulating layer. Accordingly, it is possible to increase a contact surface with the solder resist disposed on the support insulating layer, thereby improving bonding force between the support insulating layer and the solder resist.

In addition, the circuit board in the embodiment can be applied to a 5G communication system, and accordingly, transmission loss of a high frequency can be minimized, thereby further improving the reliability. Specifically, the circuit board in the embodiment can be used at the high frequency and can reduce wave loss.

Hereinafter, a process of manufacturing a circuit board according to an embodiment will be described.

FIGS. 6 to 15 are views showing a method of manufacturing the circuit board shown in FIG. 3 in order of process.

Referring to FIG. 6, in the embodiment, first, a process of manufacturing an inner substrate 100-1 for manufacturing an inner portion of the circuit board 100 may be performed.

The process for manufacturing the inner layer substrate 100-1 will be briefly described.

The inner layer substrate 100-1 may include one insulating layer, or alternatively, a plurality of insulating layers.

It is illustrated in FIG. 6 that the inner-layer substrate 100-1 has an insulating layer structure with seven layers, but the embodiment is not limited thereto. For example, the inner layer substrate 100-1 may include an insulating layer less than seven layers, or alternatively, more than seven layers.

The inner layer substrate 100-1 may include remaining insulating layers excluding an insulating layer disposed on an outermost layer of the circuit board 100. For example, the inner layer substrate 100-1 may include an insulating layer disposed on an uppermost portion of the circuit board 100 and remaining insulating layers excluding an insulating layer disposed on a lowermost portion of the circuit board 100.

Briefly describing the process of manufacturing the inner layer substrate 100-1, first, the first insulating layer 111 is prepared.

Then, when the first insulating layer 111 is prepared, a first via V1 is formed in the first insulating layer 111, and a circuit pattern 121 and a second circuit pattern 1 22 are formed on upper and lower surfaces of the first insulating layer 111, respectively.

Thereafter, a second insulating layer 112 is formed on the first insulating layer 111, and a third insulating layer 113 is formed under the first insulating layer 111.

Next, a second via V2 is formed in the second insulating layer 112, and a third circuit pattern 123 is formed on an upper surface of the second insulating layer 112. In addition, a third via V3 is formed in the third insulating layer 113, and a fourth circuit pattern 124 is formed under a lower surface of the third insulating layer 113.

Thereafter, a fourth insulating layer 114 is formed on the second insulating layer 112, and a fifth insulating layer 115 is formed under the third insulating layer 113.

Next, a fourth via V4 is formed in the fourth insulating layer 114, and a fifth circuit pattern 125 is formed on an upper surface of the fourth insulating layer 114. In addition, a fifth via V5 is formed in the fifth insulating layer 115, and a sixth circuit pattern 126 is formed under a lower surface of the fifth insulating layer 115.

Thereafter, a sixth insulating layer 116 is formed on the fourth insulating layer 114, and a seventh insulating layer 117 is formed under the fifth insulating layer 115.

Next, a sixth via V6 is formed in the sixth insulating layer 116, and a seventh circuit pattern 127 is formed on an upper surface of the sixth insulating layer 116. In addition, a seventh via V7 is formed in the seventh insulating layer 117, and an eighth circuit pattern 128 is formed under a lower surface of the seventh insulating layer 117.

Since the process of manufacturing the inner layer substrate 100-1 is a known technique in a technical field to which the present invention pertains, a detailed description thereof will be omitted.

Referring to FIG. 7, when the inner layer substrate 100-1 is manufactured, an eighth insulating layer 118 corresponding to a first outermost insulating layer is formed on an upper surface of the inner layer substrate 100-1. In addition, a ninth insulating layer 119 corresponding to a second outermost insulating layer is formed under a lower surface of the inner layer substrate 100-1.

In this case, when the eighth insulating layer 118 and the ninth insulating layer 119 are stacked, a primer layer 150 may be respectively disposed on the upper surface of the eighth insulating layer 118 and the lower surface of the ninth insulating layer 119, and a metal layer 155 may be disposed on the primer layer 150. The metal layer 155 may serve to planarize the eighth insulating layer 118 and the ninth insulating layer 119 to have uniform heights. For example, the metal layer 155 may be disposed in order to improve stacking reliability of the eighth insulating layer 118 and the ninth insulating layer 119.

The primer layer 150 may serve to increase bonding force between a first outer layer circuit pattern 130 and a second outer layer circuit pattern 140 that are disposed on and under the eighth insulating layer 118 and the ninth insulating layer 119, respectively. That is, when the first outer layer circuit pattern 130 and the second outer layer circuit pattern 140 are disposed without the primer layer 150, the bonding force between the eighth insulating layer 118 and the second outer layer circuit pattern 140 is low, and thus they may be separated from each other.

Meanwhile, it is illustrated in FIG. 7 that the primer layer 150 is respectively disposed on the upper surface of the eighth insulating layer 118 and the lower surface of the ninth insulating layer 119, but the embodiment is not limited thereto. For example, the primer layer 150 may be selectively disposed on a surface of an insulating layer on which a fine circuit pattern is to be disposed. That is, when only the first outer layer circuit pattern 130 is a fine circuit pattern, the primer layer 150 may be disposed only on the lower surface of the ninth insulating layer 119. In addition, when only the second outer layer circuit pattern 140 is a fine circuit pattern, the primer layer 150 may be disposed only on the upper surface of the eighth insulating layer 118. In addition, when the first outer layer circuit pattern 130 and the second outer layer circuit pattern 140 are both fine circuit patterns, the primer layer 150 may be disposed on both the upper surface of the eighth insulating layer 118 and the lower surface of the ninth insulating layer 119.

Referring to FIG. 8, when the eighth insulating layer 118 and the ninth insulating layer 119 are disposed, a via hole VH is respectively formed in the eighth insulating layer 118 and the ninth insulating layer 119. In this case, the via hole VH may be respectively formed not only in the eighth insulating layer 118 and the ninth insulating layer 119 but also in the primer layer 150 and the metal layer 155.

Next, referring to FIG. 9, when the via hole VH is formed, an etching process of removing the metal layer 155 disposed on the primer layer 150 may be performed. For example, after the via hole VH is formed, a flash etching process may be performed to remove the metal layer 155, and thus a process for exposing a surface of the primer layer 150 may be performed.

Next, referring to FIG. 10, a via V forming process for filling the via hole VH may be performed, and thus the second outer layer circuit pattern 140 may be formed on the upper surface of the eighth insulating layer 118, and the first outer layer circuit pattern 130 may be formed on the lower surface of the ninth insulating layer 119. In this case, in the embodiment, it is illustrated that the first outer layer circuit pattern 130 is a general circuit pattern rather than a fine circuit pattern, but the embodiment is not limited thereto, and the first outer layer circuit pattern 130 together with the second outer layer circuit pattern may be a fine circuit pattern. Accordingly, when the first outer layer circuit pattern 130 is a general circuit pattern, the primer layer 150 between the ninth insulating layer 119 and the first outer layer circuit pattern 130 may be omitted.

The second outer layer circuit pattern 140 is disposed on the upper surface of the eighth insulating layer 118. In this case, the second outer layer circuit pattern 140 disposed on the upper surface of the eighth insulating layer 118 may include a portion disposed in a first region R1 corresponding to an open region of the first protective layer 170 and a portion disposed in a second region R2 where the first protective layer 170 is disposed. In addition, each of the portions may include a trace 141 that is a wiring line for signal transmission and a pad 142 that may correspond to an end of the trace 141 and to which a component is to be attached.

Next, referring to FIG. 11, a support layer 160 is formed on the primer layer 150 so as to cover the second outer layer circuit pattern 140. In this case, the support layer 160 may be disposed on the primer layer 150 and the second outer layer circuit pattern 140. That is, the support layer 160 may be formed on the first region R1 and the second region R2. The support layer 160 may be formed so as to have a height greater than that of the second outer layer circuit pattern 140.

Next, referring to FIG. 12, a process of removing an upper region of the support layer 160 using a sand blast 200 may be performed to perform a process of exposing an upper surface of the second outer layer circuit pattern 140 disposed on the primer layer 150.

In this case, the process of removing the upper region of the support layer 160 may be performed using a physical method.

That is, as the process of removing the upper region of the support layer 160, a physical method such as sandblasting or sanding may be used, or a chemical method such as plasma treatment may be used. However, when the upper region of the support layer 160 is removed by using a chemical method such as plasma treatment, it is very difficult to make the support layer 160 and the second outer layer circuit pattern 140 have the same height. That is, when the upper region of the support layer 160 is removed by using the chemical method such as the plasma treatment, a residue remains on the second outer layer circuit pattern 140, and in a subsequent process of removing the residue, a change in a cross-section of the second outer layer circuit pattern 140 may occur. For example, when a plasma method rather than sand blasting is used, the cross-section of the second outer layer circuit pattern in a final product may have a triangular shape rather than a quadrangular shape.

Therefore, in the embodiment, as shown in FIG. 12, the upper region of the support layer 160 is removed to a level having the same height as the second outer layer circuit pattern 140 using the physical method such as sand blasting.

In this case, as shown in FIG. 13, in a polishing process using the sand blast 200, it may be achieved by controlling a process condition.

Here, a controllable process condition in the polishing process using the sand blast 200 may include a moving speed of a panel to be processed, an abrasive ejection pressure, and a nozzle moving speed. Accordingly, in the embodiment, the upper surface of the support layer 160 has a U-shape by changing at least one of the panel moving speed, the abrasive ejection pressure, and the nozzle moving speed included in the process condition.

For example, in a state in which the abrasive ejection pressure and the nozzle moving speed are fixed, a shape of the upper surface of the support layer 160 may be changed by controlling only the panel moving speed. That is, as the panel moving speed increases, the upper surface of the support layer 160 may become closer to a flat surface.

FIGS. 14A and 14B are view showing a shape of the upper surface of the support layer according to the polishing process condition according to the embodiment.

Referring to FIG. 14A, when the panel moving speed is increased, polishing is performed at a high speed in a region between the second outer layer circuit patterns 140, and accordingly, an upper surface 160a of the support layer 160 may be substantially a flat surface. For example, when the panel moving speed is set to 80 mm/min, the upper surface 160a of the support layer 160 may have a flat surface.

In addition, as shown in FIG. 14B, the upper surface of the support layer 160 may change from a flat surface to a curved surface by reducing the panel moving speed. In this case, when the panel moving speed is reduced, more polishing is performed in a region between the outer layer circuit patterns 140. In this case, in the region between the outer layer circuit patterns 140, a polishing restriction is generated by the outer layer circuit pattern 140 in a portion adjacent to the outer layer circuit pattern 140, and more polishing is performed at a portion far from the outer layer circuit pattern 140. Therefore, when the panel moving speed is reduced as described above, the upper surface of the support layer 160 may have a shape in which a height decreases from an edge region toward an inner region. That is, when the panel moving speed is reduced to 70 mm/min as in (a) of FIG. 14B, an upper surface 160b of the support layer 160 may have a first difference value between a highest portion and a lowest portion. In addition, when the panel moving speed is reduced to 60 mm/min as in (b) of FIG. 14B, an upper surface 160c of the support layer 160 has a second difference value between a highest portion and a lowest portion greater than the first difference value. Therefore, in the embodiment, the panel moving speed or the polishing ejection pressure may be changed so as to satisfy a height condition in the range as described above, so that the upper surface of the support layer 160 has a curved surface rather than a flat surface.

Next, as shown in FIG. 15, when an etching process of the second outer layer circuit pattern 140 is completed, a process of disposing the first protective layer 170 and the second protective layer 175 on the second region R2 may be performed.

Meanwhile, in the embodiment, a package substrate may be manufactured using the above-described circuit board.

For example, an adhesive portion (not shown) may be disposed on the pad 142 of the second outer layer circuit pattern 140 of the circuit board. In addition, a chip may be disposed on the adhesive portion.

For example, a plurality of the pads 142 may be formed to be spaced apart in a width direction, and a plurality of the chips may be mounted on the plurality of pads.

For example, any one chip of a central processor (e.g., CPU), a graphic processor (e.g., GPU), a digital signal processor, an encryption processor, a microprocessor, and a microcontroller may be mounted on the pad 142.

For example, at least two different chips among the central processor (e.g., CPU), the graphic processor (e.g., GPU), the digital signal processor, the encryption processor, the microprocessor, and the microcontroller may be mounted on the pad.

The circuit board in the embodiment is a circuit board having a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern positioned in a first region where a solder resist (SR) is not disposed among an upper region of the outer insulating layer and a second outer layer circuit pattern positioned in a second region where the solder resist is disposed. In this case, the second outer layer circuit pattern may be supported by the solder resist, but the first outer layer circuit pattern does not have a support layer capable of supporting the first outer layer circuit pattern, and thus there is a problem that the first outer layer circuit pattern may easily collapse due to various factors. Accordingly, in the embodiment, a support insulating layer capable of supporting the first outer layer circuit pattern positioned in the first region is formed.

An upper surface of the support insulating layer has a height equal to or lower than that of the first and second external circuit patterns on the outer insulating layer.

Accordingly, in the embodiment, it is possible to solve problems such as collapsing or rubbing of the protruding first outer layer circuit pattern by making the outer layer circuit pattern fine, thereby improving product reliability. In particular, in the embodiment, it is possible to solve problems such as collapsing or rubbing of the outer layer circuit pattern on the first region where the solder resist is not disposed, thereby improving the product reliability.

In addition, in the embodiment, in removing the support insulating layer, a physical method such as sand blasting is used instead of a chemical method such as plasma. Accordingly, when the support insulating layer is removed by plasma, a residual resin may remain on a surface of the outer layer circuit pattern, and accordingly, an additional process of removing the residual resin should be performed. In this case, in order to remove the residual resin, the surface of the outer layer circuit pattern should be etched, and accordingly, the outer layer circuit pattern may be deformed. For example, when the outer layer circuit pattern is etched, a cross-section of the outer layer circuit pattern may have a triangular shape. In addition, when the cross-section of the outer layer circuit pattern has the triangular shape, an adhesive member may not be stably disposed on the outer layer circuit pattern, thereby occurring a reliability problem. In contrast, in the embodiment, in removing the support insulating layer, the surface of the outer layer circuit pattern is exposed through a physical method such as sand blasting or a sanding method. In addition, when the support insulating layer is removed by the sand blasting and the sanding method, it is possible to align an upper surface of the supporting layer and an upper surface of the outer layer circuit pattern at substantially the same height, and furthermore, a shape of the upper surface of the support insulating layer may be controlled to a desired shape. Accordingly, in the embodiment, the adhesive member may be stably disposed on the outer layer circuit pattern while maintaining a quadrangular shape of the cross-sectional shape of the outer layer circuit pattern, thereby improving reliability.

In addition, in an embodiment, the shape or a surface area of the upper surface of the support insulating layer may be controlled by adjusting a sand blasting process condition for removing the support insulating layer. Specifically, in the embodiment, the shape or the surface area of the upper surface of the support insulating layer may be controlled by adjusting at least one of a moving speed of the circuit board moving on a sand blasting device, an ejection pressure of an abrasive and a moving speed of a nozzle that ejects the abrasive. That is, in the embodiment, an outer region of the upper surface of the support insulating layer has a height higher than that of an inner region by adjusting the moving speed or the ejection pressure. For example, in the embodiment, the upper surface of the support insulating layer may have a concave shape in which the outer region has a first height and the inner region has a second height that is lower than the first height. That is, in the embodiment, the upper surface of the support insulating layer may have different heights depending on a position. That is, the upper surface of the support insulating layer may include a highest portion having the highest height and a lowest portion having the lowest height. In addition, the highest portion may be positioned adjacent to the outer layer circuit pattern, and the lowest portion may be positioned farther from the outer layer circuit pattern compared to the highest portion. Accordingly, in the embodiment, the shape of the upper surface of the support insulating layer may have the concave shape to increase the surface area of the upper surface of the support insulating layer. Accordingly, it is possible to increase a contact surface with the solder resist disposed on the support insulating layer, thereby improving bonding force between the support insulating layer and the solder resist.

In addition, the circuit board in the embodiment can be applied to a 5G communication system, and accordingly, transmission loss of a high frequency can be minimized, thereby further improving the reliability. Specifically, the circuit board in the embodiment can be used at the high frequency and can reduce wave loss.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

The invention claimed is:

1. A circuit board comprising:
a build-up insulating layer including a plurality of first insulating layers laminated along a vertical direction;
a second insulating layer disposed on the build-up insulating layer;
a circuit pattern disposed on the build-up insulating layer and passing through the second insulating layer; and
a third insulating layer disposed on the second insulating layer,
wherein an upper surface of the second insulating layer includes a concave portion concave with respect to the build-up insulating layer, and
wherein a lower surface of the third insulating layer includes a convex portion in contact with the upper surface of the second insulating layer and convex with respect to the build-up insulating layer.

2. The circuit board of claim 1,
wherein the second insulating layer does not vertically overlap the circuit pattern.

3. The circuit board of claim 2, wherein the third insulating layer is respectively disposed on the second insulating layer and the circuit pattern,
the convex portion of the third insulating layer is in contact with the concave portion of the second insulating layer, and
the third insulating layer further includes a flat portion extended from the convex portion in a horizontal direction and in contact with the circuit pattern.

4. The circuit board of claim 1, wherein the second insulating layer includes an insulating material different from that of the third insulating layer.

5. The circuit board of claim 4, wherein
the second insulating layer includes at least one of an ajinomoto build-up film (ABF), resin coated copper (RCC), or a photo imageable dielectric resin (PID), and
the third insulating layer includes a solder resist.

6. The circuit board of claim 1, wherein the second insulating layer is provided to surround a side surface of the circuit pattern without contacting an upper surface of the circuit pattern.

7. The circuit board of claim 6, wherein a highest portion of the concave portion of the second insulating layer is positioned lower than the upper surface of the circuit pattern.

8. The circuit board of claim 1, wherein a height of the concave portion of the second insulating layer is lowered as it goes away from the side surface of the circuit pattern.

9. The circuit board of claim 1, wherein at least a part of the convex portion of the third insulating layer is positioned lower than an upper surface of the circuit pattern.

10. The circuit board of claim 9, wherein a vertical distance from a lowest portion of the convex portion of the third insulating layer to the upper surface of the circuit pattern satisfies a range of 20% to 50% of a vertical distance from the upper surface of the circuit pattern to a lower surface of the circuit pattern.

11. The circuit board of claim 1, wherein a vertical distance from a lower surface of the second insulating layer to a lowest portion of the concave portion of the second insulating layer satisfies a range of 50% to 90% of a vertical distance from an upper surface of the circuit pattern to a lower surface of the circuit pattern.

12. The circuit board of claim 1, wherein a vertical distance from a lower surface of the second insulating layer to a highest portion of the concave portion of the second insulating layer satisfies a range of 90% to 100% of a vertical distance from an upper surface of the circuit pattern to a lower surface of the circuit pattern.

13. The circuit board of claim 1, wherein a vertical distance from a highest portion of the concave portion to a lowest portion of the concave portion of the second insulating layer satisfies a range of 10% to 20% of a vertical distance from an upper surface of the circuit pattern to a lower surface of the circuit pattern.

14. The circuit board of claim 1, wherein a highest portion of the concave portion of the second insulating layer is closer to the circuit pattern than a lowest portion of the concave portion of the second insulating layer.

15. The circuit board of claim 14, wherein a highest portion of the convex portion of the third insulating layer is closer to the circuit pattern than a lowest portion of the convex portion of the second insulating layer.

16. The circuit board of claim 1, wherein the third insulating layer includes an opening configured to vertically overlap at least a part of the circuit pattern and at least a part of the second insulating layer.

17. The circuit board of claim 1, wherein the circuit pattern includes a plurality of patterns spaced apart from each other along the horizontal direction.

18. The circuit board of claim 17, wherein at least a part of the circuit pattern is disposed on the uppermost insulating layer.

19. The circuit board of claim 17, further comprising a fourth insulating layer disposed between the uppermost insulating layer and the second insulating layer, wherein the circuit pattern and the second insulating layer are disposed on the fourth insulating layer.

20. The circuit board of claim 17, wherein the convex portion is positioned between the plurality of patterns and overlaps the plurality of patterns along the horizontal direction.

\* \* \* \* \*